US 6,569,717 B1

(12) United States Patent
Murade

(10) Patent No.: US 6,569,717 B1
(45) Date of Patent: May 27, 2003

(54) SEMICONDUCTOR DEVICE PRODUCTION METHOD, ELECTRO-OPTICAL DEVICE PRODUCTION METHOD, SEMICONDUCTOR DEVICE, AND ELECTRO-OPTICAL DEVICE

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/514,296

(22) Filed: Feb. 28, 2000

(30) Foreign Application Priority Data

Feb. 26, 1999 (JP) .......................... 11-050673
Feb. 4, 2000 (JP) ....................... 2000-027112

(51) Int. Cl.⁷ ............................................... H01L 29/04
(52) U.S. Cl. ................... 438/149; 257/296; 257/297; 257/298; 257/299; 257/300; 257/72
(58) Field of Search ...................... 257/59, 296–300, 257/72

(56) References Cited

U.S. PATENT DOCUMENTS 5,627,084 A * 5/1997 Yamazaki et al.
6,004,831 A * 12/1999 Yamazaki et al.
6,320,204 B1 * 11/2001 Hirabayashi et al.

FOREIGN PATENT DOCUMENTS

| JP | 4-291240 | 10/1992 |
| JP | 4-333828 | 11/1992 |
| JP | 5-166837 | 7/1993 |
| JP | 6-112222 | 4/1994 |
| JP | 7-321329 | 12/1995 |
| JP | 2000-027112 | 6/2002 |

* cited by examiner

*Primary Examiner*—Fetsum Abraham
(74) *Attorney, Agent, or Firm*—Oliff & Berridge, PLC.

(57) ABSTRACT

A liquid crystal device, which is an example of an electro-optical device, includes a TFT, a data line, a scanning line, a second capacitor electrode, and a pixel electrode, all formed on a TFT array substrate. The pixel electrode and the TFT are electrically connected to each other via a conductive layer and via two contact holes. A second storage capacitor is formed between the second capacitor electrode and a part of the conductive layer, wherein a part of a second insulating thin film is disposed between the second capacitor electrode and the part of the conductive layer. The second insulating thin film is formed of an oxide film obtained by oxidizing the scanning line and the second capacitor electrode.

19 Claims, 9 Drawing Sheets

SEMICONDUCTOR DEVICE PRODUCTION METHOD, ELECTRO-OPTICAL DEVICE PRODUCTION METHOD, SEMICONDUCTOR DEVICE, AND ELECTRO-OPTICAL DEVICE

BACKGROUND OF THE INVENTION

1. Field of Invention

The present invention relates to a method of producing a semiconductor device, to a method of producing an electro-optical device such as an active matrix driving liquid crystal device, to a semiconductor device, and to an electro-optical device. More particularly, the present invention relates to a semiconductor device and an electro-optical device, each having a thin film transistor (hereinafter also referred to as a TFT) and an additional storage capacitor both formed on a substrate, and also relates to a method of producing such a semiconductor device and a method of producing such an electro-optical device.

2. Description of Related Art

In a TFT-driven active matrix liquid crystal device according to a conventional technique, TFTs are disposed at respective intersections of a great number of scanning lines and data lines extending horizontally and vertically, respectively, wherein the gate electrode of each TFT is connected to one scanning line, the source region of each TFT is connected to one data line, and the drain region of each TFT is connected to one pixel electrode via a contact hole formed through an interlayer insulating film for electrically isolating various layers forming TFTs and interconnection lines and pixel electrodes. Thus, the pixel electrodes and the corresponding semiconductor layers are connected to each other through contact holes extending across a large interlayer distance of 1000 nm or greater. In particular, in the case of polysilicon TFTs of the normal stagger or coplanar type having a top gate structure in which the gate electrode is disposed above the semiconductor layer when seen from the side of the TFT array substrate, the interlayer distance of the contact holes becomes very long, and thus, it becomes difficult to form the contact holes. More specifically, because the etching accuracy becomes worse as the etching depth increases, there is a possibility that overetching occurs to a great extent, which causes a hole to be formed through the semiconductor layer. Thus, it is very difficult to form such a deep contact hole using only a dry etching process. One technique to solve the above problem is to employ a combination of dry etching and wet etching. However, this technique results in another problem in that the wet etching can cause the contact hole to be expanded in a lateral direction. As a result, it becomes difficult to form contact holes with a sufficiently small diameter, and thus, it becomes difficult to lay a required number of interconnections and electrodes in a limited area on a substrate.

The technique of connecting an additional storage capacitor to a TFT is employed not only in electro-optical devices, but also in semiconductor devices such as a dynamic type shift register or a DRAM (dynamic random access memory).

SUMMARY OF THE INVENTION

In general, in the art of electro-optical devices of the above-described type, there is a significant need for improvement in image quality. To this end, it is very important to achieve an image display area with a higher resolution by reducing the pixel pitch. It is also very important to increase the pixel aperture ratio (the ratio of an aperture area of a pixel through which image light can pass to a non-aperture area of the pixel through which image light cannot pass).

If the pixel pitch is reduced, interconnections and electrodes occupy a greater area in the image display area relative to the total image display area, because there are essential lower limits in the electrode size, the interconnection width and the contact hole diameter due to limitations of production technology. As a result, the pixel aperture ratio becomes low. Another problem resulting from the reduction in the pixel pitch is that it becomes difficult for a storage capacitor to have a sufficiently large capacitance to maintain a signal voltage applied to a pixel electrode, because the storage capacitor has to be formed in a smaller limited area on a substrate.

Also in other semiconductor devices such as a dynamic shift register or a DRAM having a storage capacitor, as in the pixel switching TFT described above, there is difficulty in reducing the feature size of circuit elements including storage capacitors due to a limitation of a processing technique of forming a contact hole reaching a semiconductor layer on a substrate.

In view of the above, it is an object of the present invention to provide a method of producing a semiconductor device and an electro-optical device capable of forming a good electrical connection between a pixel electrode or an interconnection line and a TFT, and also capable of forming a storage capacitor with an increased capacitance, thereby realizing a semiconductor device and an electro-optical device having high reliability by using a relatively simple structure having a small feature size of pixel pitch or circuit pitch.

According to an aspect of the present invention, to achieve the above object, there is provided a method of producing a semiconductor device, which may consist the steps of: forming a semiconductor layer on a substrate, the semiconductor layer serving as source and drain regions of a thin film transistor and a first capacitor electrode of a storage capacitor; forming a first insulating thin film on the semiconductor layer; forming a gate electrode and a second capacitance electrode of the storage capacitor, on the first insulating thin film, using the same film; forming a second insulating thin film on the surface of the gate electrode and on the surface of the second capacitor electrode; and forming a conductive layer serving as a third capacitor electrode of the storage capacitor, the conductive layer being connected to the semiconductor layer and opposing the second capacitor electrode via the second insulating thin film.

In this method, the first capacitor electrode is formed of the semiconductor layer which is also used to form the source and drain regions, the scanning line and the second capacitor electrode are formed of the same film, and the conductive layer serving as the third capacitor electrode is formed on the second capacitor electrode via the second insulating thin film such that a first storage capacitor is formed by the first and second capacitor electrodes and the first insulating thin film disposed between the first and second capacitor electrodes, and such that a second storage capacitor is formed by the second capacitor electrode and the conductive layer and the second insulating thin film disposed between the second capacitor electrode and the conductive layer. Thus, the storage capacitors can be easily formed using a process including a relatively small number of steps.

In particular, because the conductive layer is formed using a space on the second capacitor electrode instead of forming it on the gate electrode, it is possible to eliminate a parasitic capacitance which may occur between the gate electrode and the drain region connected to the conductive layer if the conductive layer is formed on the gate electrode. This makes it possible to prevent degradation in the image quality due to parasitic capacitance.

In a method of producing a semiconductor device according to another aspect of the present invention, the second insulating thin film includes an oxide film formed by oxidizing the surface of the gate electrode and the surface of the second capacitor electrode.

In this aspect, because the second insulating thin film serving as a dielectric film is formed by oxidizing the surface of the gate electrode and the surface of the second capacitor electrode, a high-quality interface having good uniformity and good adherence is obtained between the second insulating thin film realized in the form of an oxide film and the gate electrode and between the second insulating thin film and the second capacitor electrode. This resultant second insulating thin film has a low density of defects and has a high breakdown voltage, even if the thickness thereof is rather small. Thus, by partially using the conductive layer to form the third capacitor electrode which opposes the second capacitor electrode via the second insulating thin film, it is possible to form a storage capacitor whose dielectric film is realized by the second insulating thin film having the high breakdown voltage and having the low density of defects.

This technique makes it possible to produce a storage capacitor having large capacitance and having good reliability. If the dielectric film on the gate electrode and second capacitor electrode is formed by means of a process other than oxidation, such as sputtering or CVD (chemical vapor deposition), then the resultant dielectric film will have a low breakdown voltage and tends to have faulty insulation.

To obtain a high enough breakdown voltage and sufficiently good isolation using such a dielectric film, it is required to increase the thickness of the dielectric film to a great extent. However, such an increase in the thickness often results in formation of steps in various layers formed above the dielectric film and also results in an increase in production cost. Furthermore, the increase in the thickness of the dielectric film results in a reduction in the storage capacitance per unit area, and thus this dielectric film is not suitable as the dielectric film of the storage capacitor. In contrast, in the present invention, the oxide film is employed as the dielectric film as described above, and thus the dielectric film has as high quality as the gate insulating film of the thin film transistor. This results in an improvement in overall reliability of the semiconductor device, and also an improvement in production yield.

In this production method according to the present invention, the oxide film is preferably a thermal oxide film formed by thermally oxidizing the surface of the gate electrode and the surface of the second capacitor electrode at a temperature in the range from 900° C. to 1200° C.

According to this aspect of the invention, it is possible to relatively easily form a thin oxide film having a high breakdown voltage and a low defect density on the gate electrode and the second capacitor electrode by performing a high-temperature process using a quartz substrate.

In this aspect of the invention, the production method preferably includes a further step of selectively doping an impurity into the semiconductor layer before the step of forming the thermal oxide film, wherein the impurity doped in the semiconductor layer is activated when the thermal oxide film is formed in the step of forming the thermal oxide film.

According to this aspect of the invention, the heat treatment, required to activate the impurity doped in the semiconductor layer so that the doped impurity becomes bonded in the crystal lattice, is performed simultaneously during the process of forming the oxide film, and thus the production process is simplified.

The steps following the step of forming the second dielectric film may be performed at temperatures equal to or lower than 400° C.

In this case, materials having low heat resistance may be used to form layers in the steps after forming the oxide film.

The gate electrode and the second capacitor electrode may be formed of a silicon thin-film.

In this case, the oxide film including the dielectric film is a silicon oxide film formed by thermally oxidizing the surface of the polysilicon film, and thus a high-quality interface having good uniformity and good adherence is obtained between the oxide film and the gate electrode and between the oxide film and the second capacitor electrode. This makes it possible to form the oxide film as an insulating film so as to have a small thickness, a high breakdown voltage and a low density of defects.

Alternatively, the oxide film may be an anodic oxide film formed by anodizing the surface of the gate electrode and the surface of the second capacitor electrode.

In this case, the oxide film including the dielectric film is a metal oxide film formed by anodizing the surface of a film of anodizable metal such as tantalum or aluminum, and thus a high-quality interface having good uniformity and good adherence is obtained between the oxide film and the gate electrode and between the oxide film and the second capacitor electrode. Therefore, it is possible to form the oxide film as an insulating film so as to have a small thickness, a high breakdown voltage and a low density of defects. In particular, when a tantalum oxide film is formed by anodizing tantalum, the resultant insulating film has a high dielectric constant of about 21.7 in contrast to the silicon oxide film having a dielectric constant of about 3.9.

In another aspect of the semiconductor device production method according to the present invention, the second insulating thin film preferably has a thickness in the range from 10 nm to 200 nm.

In this aspect, the second insulating thin film is formed so as to have a relatively small thickness, in the range of 10 nm to 200 nm, which does not result in a short circuit between electrodes through the second insulating thin film. Such a small thickness of the second insulating thin film is advantageous when it is used as the dielectric film of the storage capacitor. Even when the thickness is reduced to such a small value, it is still possible to obtain a good interface between the second insulating thin film and the scanning line and between the second insulating thin film and the second capacitor electrode.

In another aspect of the semiconductor device production method according to the present invention, the method preferably includes a further step of forming a third insulating thin film between the second insulating thin film and the conductive layer.

In this aspect, the insulating film is formed in a laminated structure or a multilayer structure consisting of the second insulating thin film and the third insulating thin film formed thereon, and thus the resultant insulating film can be used as a dielectric film having a higher breakdown voltage and a lower density of defects. Furthermore, it becomes possible to suppress shrinkage or warp of a substrate due to heating, even when a large-sized mother substrate is employed.

In this aspect, the third insulating thin film may be formed of at least one of a silicon oxide film and a silicon nitride film.

In this case, the insulating film is formed into a laminated structure or a multilayer structure including two ore more layers of silicon oxide or silicon nitride. Herein, the silicon oxide film and the silicon nitride film may be formed using a CVD technique, a sputtering method or the like. Silicon oxide films and the silicon nitride-films may be alternately formed into a multilayer structure.

In another aspect of the semiconductor device production method according to the present invention, the method preferably includes a further step of doping an impurity into the semiconductor layer using the gate electrode as a mask, before forming the second insulating thin film, wherein after doping the impurity into the semiconductor layer, the second insulating thin film is formed by oxidizing the surface of the gate electrode and the surface of the second capacitor electrode.

In this aspect, after doping the impurity into the semiconductor layer using the gate electrode as the mask having a width greater than a final value, the semiconductor layer is oxidized. The width of the gate electrode and the width of the second capacitor electrode decrease during the oxidization process. The reduction in the width results in formation of regions doped with no impurity between the edges of the width of the gate electrode and the edges of the regions doped with the impurity. The these undoped regions of the semiconductor layer may serve as offset regions.

Alternatively, a low concentration of impurity may be selectively implanted into these regions at a properly selected acceleration energy thereby forming LDD (lightly doped drain) regions. In any case, a photolithography process is not required. It is also possible to suppress variations in characteristics caused by an alignment error of an exposure apparatus in the photolithography process, and thus, it is possible to form a thin film transistor so as to have a shorter channel length which allows a reduction in the size of a semiconductor device.

In another aspect of the semiconductor device production method according to the present invention, the method preferably includes further steps of doping the semiconductor layer with a first concentration of impurity using the gate electrode as a mask, before forming the second insulating thin film; and doping the semiconductor layer with a second concentration of impurity via a mask which completely covers the gate electrode and which has a width greater than the width of the gate electrode.

In this aspect, after doping the impurity into the semiconductor layer using the gate electrode as the mask having a width greater than a final value, the semiconductor layer is oxidized. The width of the gate electrode decreases during the oxidization process as described above, and the reduction in the width results in formation of regions doped with no impurity between the edges of the width of the gate electrode and the edges of the regions doped with the impurity. These regions serve as offset regions. When the semiconductor layer is further doped with the second concentration of impurity via the mask which completely covers the gate electrode and which has a width greater than the width of the gate electrode, LDD regions are formed in the semiconductor layer at locations immediately below the mask. Thus, it is possible to realize a thin film transistor having both offset regions and LDD regions using the production process including less number of steps associated with photolithography. This allows the thin film transistor to have a higher breakdown voltage. Furthermore, it is possible to form the thin film transistor so as to have a shorter channel length which allows a reduction in the size of a semiconductor device.

In another aspect of the semiconductor device production method according to the present invention, the method preferably includes further steps of doping the semiconductor layer with a first concentration of impurity using the gate electrode as a mask, before forming the second insulating thin film; and selectively doping the semiconductor layer with a second concentration of impurity, after forming the second insulating thin film.

In this aspect, after doping the impurity into the semiconductor layer using the gate electrode as the mask having a width greater than a final value, the semiconductor layer is oxidized. The width of the gate electrode decrease during the oxidization process. As a result, regions doped with no impurity are formed between the edges of the gate electrode and the edges of the regions doped with the impurity. After that, the second concentration of impurity is selectively implanted into the undoped regions of the semiconductor layer between the edges of the gate electrode and the edges of the regions doped with the first concentration of impurity, at an acceleration energy which is selected, taking into account the thickness of the second insulating thin film formed on the side walls of the gate electrode, thereby forming LDD regions.

In this technique, because the LDD regions are formed without using the photolithography process, it is possible to eliminate a reduction in production yield which would occur during the photolithography process. It is also possible to eliminate variations in characteristics caused by an alignment error of an exposure apparatus in the photolithography process, and thus, it becomes possible to form the thin film transistor so as to have a shorter channel length, which allows a reduction in the size of a semiconductor device.

In another aspect of the semiconductor device production method according to the present invention, the method preferably includes a further step of selectively doping an impurity into the semiconductor layer after forming the second insulating thin film.

In this aspect, using the second insulating thin film formed on the side walls of the gate electrode, the doping of the impurity into regions of the semiconductor layer other than the region below the gate electrode and below the side walls of the gate electrode, and the doping of the impurity into the regions of the semiconductor layer immediately below the second insulating thin film formed on the side walls of the gate electrode, can be performed by properly selecting the acceleration energy for the respective implantation processes. Thus, the offset regions or the LDD regions can be formed at locations adjacent to the channel region without using the photolithography process. This eliminates a reduction in production yield which would occur during the photolithography process. It is also possible to eliminate variations in characteristics caused by an alignment error of an exposure apparatus in the photolithography process.

According to another aspect of the invention, there is provided a semiconductor device which may consist of a third capacitor electrode formed of a multilayer film including two or more layers of conductive polysilicon film and refractory metal.

In this aspect, the third capacitor electrode formed of the electrically conductive polysilicon film does not serve as a light blocking film but can serve to increase the storage capacitor and to provide an interconnection. When the semiconductor layer is electrically connected to the electrically conductive polysilicon film, if they are formed of the same polysilicon film, then the contact resistance between them is reduced to a very low level. If a refractory metal layer is formed on the electrically conductive polysilicon film into a multilayer structure, the resultant multilayer film can serve as a light-shielding film, and a further reduction in resistance can be achieved.

According to another aspect of the present invention, there is provided a method of producing an electro-optical device including a data line and a pixel electrode both formed on the above-described substrate, the data line being connected to the source region of the thin film transistor, the pixel electrode being connected to the drain region of the thin film transistor, the method including the steps of: forming a first interlayer insulating film on the semiconductor layer, the first insulating thin film, the gate electrode, the second insulating thin film, and the conductive layer; forming the data line such that the data line is connected to the source region via a contact hole formed through the first interlayer insulating film, the first insulating thin film, and the second insulating thin film; forming a second interlayer insulating film on the data line; and forming the pixel electrode such that the pixel electrode is connected to the conductive layer via a contact hole formed through the first and second interlayer insulating films.

In this electro-optical device according to the present invention, the scanning line, the second capacitor electrode, the second insulating thin film, the conductive layer, the first interlayer insulating film, and the data line are formed successively on the substrate in the order described above, and the pixel electrode is formed at the top. The data line is electrically connected to the source region of the semiconductor layer via the contact hole formed through the first insulating thin film and the first interlayer insulating film. Thus, the conductive layer located between the scanning line and the data line may be used for various purposes. More specifically, if the conductive layer and the semiconductor layer are electrically connected to each other via a contact hole, and the conductive layer and the pixel electrode are also electrically connected to each other via a contact hole, then the semiconductor layer and the pixel electrode are electrically connected to each other via the conductive layer. Furthermore, if a part of the conductive layer is employed as a third capacitor electrode located opposite a part of the semiconductor layer or the second capacitor electrode via the second insulating thin film, then a large storage capacitor can be added to the pixel electrode.

Furthermore, it possible to form a contact hole with a small diameter compared with the case where a single contact hole is formed such that it extends from the pixel electrode to the drain region. That is, because the etching accuracy becomes worse as the contact hole is etched to a greater depth, there is a possibility that etching occurs beyond the bottom of the insulating film, and the thin semiconductor layer is etched across the entire thickness thereof.

To avoid the above problem, the dry etching process capable of forming the contact hole so as to have a small diameter has to be stopped before the etching reaches the semiconductor layer, and the remaining part to the semiconductor layer has to be etched by means of wet etching. However, because the wet etching occurs in an isotropic fashion, the contact hole is expanded in a lateral direction. In contrast, in the present invention, the pixel electrode and the drain regions are connected to each other via two serial contact holes which can be formed by means of dry etching.

Even when a mixture of wet and dry etching is employed, the distance of the contact holes formed by wet etching can be reduced. Thus, the contact holes can be formed so as to have a small diameter, and a recess or a step formed on the surface of the conductive layer at a location corresponding to the contact hole on the side of the semiconductor layer can be minimized. As a result, the pixel electrode in this area can be planarized in a better fashion. Furthermore, a recess or a step formed on the surface of the pixel electrode at a location corresponding to the contact hole on the side of the pixel electrode is also minimized, and thus the surface of the pixel electrode in this area can be planarized in a better fashion. As a result, an electro-optical material such as a liquid crystal has a smaller number of defects such as a disclination due to a recess or a step on the surface of the pixel electrode.

The present invention also provides a semiconductor device which may consist of: a semiconductor layer formed on a substrate so as to serve as a source region, a drain region, and a channel region of a thin film transistor; a first insulating thin film formed on the semiconductor layer; and a gate electrode formed on the first insulating thin film, wherein at least one of the source region and the drain region of the thin film transistor includes: a high-concentration impurity region; a low-concentration impurity region disposed between the high-concentration impurity region and the channel region; and an offset region disposed between the low-concentration impurity region and the channel region, the offset region being located directly adjacent to the channel region.

In this aspect, the offset regions and the LDD regions formed in the thin film transistor allow the semiconductor device to have an extremely low current in an off-state.

According to another aspect of the present invention, there is provided a semiconductor device which may consist of: a semiconductor layer formed on a substrate so as to serve as a source region, a drain region, and a channel region of a thin film transistor and a first capacitor electrode of a storage capacitor; a first insulating thin film formed on the semiconductor layer; a gate electrode and a second capacitor electrode of the storage capacitor both formed on the first insulating thin film; a second insulating thin film formed on the surface of the gate electrode and on the surface of the second capacitor electrode; and a conductive layer serving as a third capacitor electrode of the storage capacitor, the conductive layer being connected to the semiconductor layer, the conductive layer opposing the second capacitor electrode via the second insulating thin film, wherein at least one of the source region and the drain region of the thin film transistor includes: a high-concentration impurity region; a low-concentration impurity region disposed between the high-concentration impurity region and the channel region; and an offset region disposed between the low-concentration impurity region and the channel region, the offset region being located directly adjacent to the channel region.

The thin film transistor according to this aspect has the offset regions and the LDD regions, and thus, it is possible to realize a semiconductor device having an extremely low current in an off-state. Furthermore, a storage capacitor with a large capacitance can be realized.

According to another aspect of the present invention, there is provided an electro-optical device which may consist of a data line and a pixel electrode both formed on the substrate of the semiconductor device described above, the data line being connected to the source region of the thin film transistor, the pixel electrode being connected to the drain region of the thin film transistor, the electro-optical device may further consist of: a first interlayer insulating film formed on the semiconductor layer, the first insulating thin film, the gate electrode, the second insulating thin film, and the conductive layer; and a second interlayer insulating film formed on the first interlayer insulating film, the data line being connected to said source region via a contact hole formed through the first interlayer insulating film, the first insulating thin film, and the second insulating thin film, the pixel electrode being connected to the conductive layer via a contact hole formed through the first and second interlayer insulating films.

In the electro-optical device according to the present aspect of the invention, the thin film transistor has the offset regions and the LDD regions, and thus has an extremely low current in an off-state. This allows the electro-optical device to display a high-quality image.

DETAILED DESCRIPTION OF PREFERRED EMBODIMENTS

Embodiments of the present invention are described below with reference to the accompanying drawings. First, a basic structure of a semiconductor device is described with reference to FIG. 1.

Figure 1:
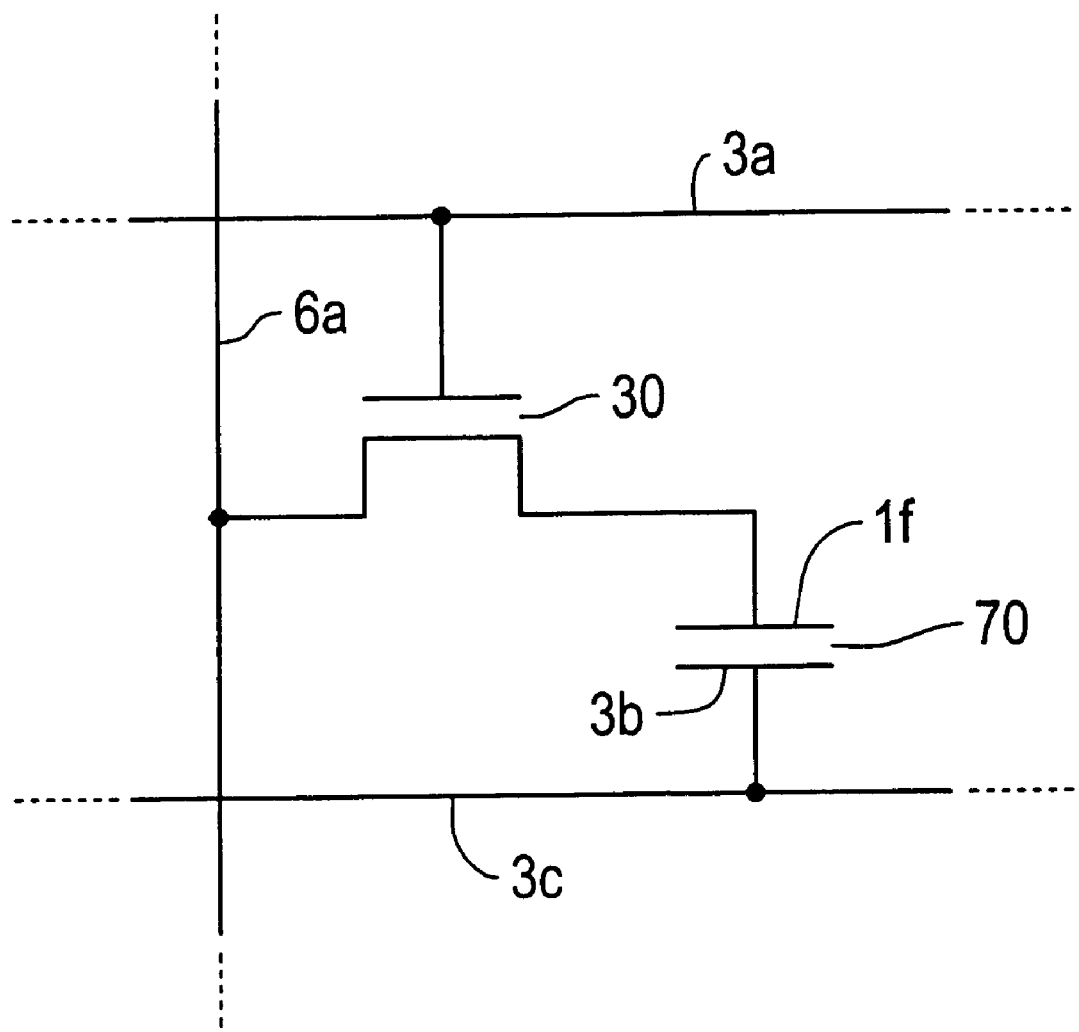
FIG. 1 is a basic equivalent circuit diagram of a DRAM illustrating a basic circuit configuration of a semiconductor device according to an exemplary embodiment.

FIG. 1 illustrates a basic equivalent circuit of a DRAM which is one example of semiconductor devices. As shown in FIG. 1, the source region of a thin film transistor (TFT) 30 is connected to a data line (bit line) 6a, and the gate electrode of the thin film transistor 30 is connected to a scanning line (word line) 3a. A storage capacitor 70 is formed between a first capacitor electrode 1f and a second capacitor electrode 3b, wherein the first capacitor electrode 1f is electrically connected to the drain region of the TFT 30 and the second capacitor electrode 3b is electrically connected to a capacitor line 3c. Embodiments as to the method of producing a semiconductor device having such a basic structure are described below with reference to the accompanying drawings.

FIGS. 2(a)–(h) are schematic diagrams illustrating the steps of producing a semiconductor device, according to a first exemplary embodiment.

Figure 2A:
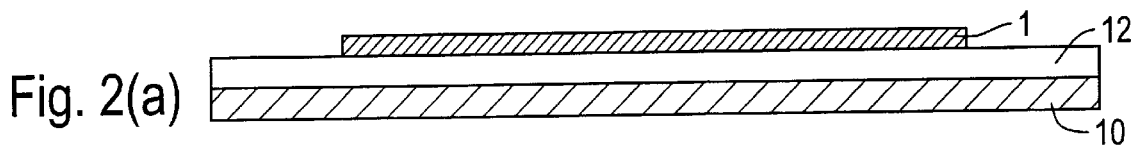
FIGS. 2(a)–(h) are schematic sectional views illustrating the steps of producing a semiconductor device, according to a first exemplary embodiment.

In step 1, as shown in FIG. 2(a), a TFT array substrate 10 such as a quartz substrate, hard glass substrate, or a silicon substrate, is first prepared. The TFT array substrate 10 is then subjected to a heat treatment at a temperature equal to or higher than the highest temperature of those at which the TFT array substrate 10 will encounter in the following steps, so that the TFT array substrate 10 will have less strain in those steps. In this particular embodiment, the heat treatment is performed at a high temperature in the range from about 900° C. to 1300° C. in an inert ambient gas, such as nitrogen.

Then, an underlying insulating film 12 of a silicate glass film such as NSG, PSG, BSG, or BPSG, a silicon nitride film, or a silicon oxide film, is formed on the TFT array substrate 10 by means of, for example, atmospheric pressure CVD or reduced pressure CVD using a gas such as TEOS (tetraethyl orthosilicate), TEB (tetraethyl borate), or TMOP (tetramethyl oxyphosphate). The underlying insulating film 12 is formed so as to have a thickness in the range of, for example, 500 nm to 2000 nm.

An amorphous silicon film is then formed on the underlying insulating film 12 by means of reduced pressure CVD (at a pressure in the range of, for example 20 Pa to 40 Pa) using mono-silane or disilane, or the like, at a flow rate of about 400 cc/min to 600 cc/min, preferably at a relatively low temperature in the range of about 450° C. to 550° C., and more preferably at about 500° C. After that, a heat treatment is performed in a nitrogen ambience at about 600° C. to 700° C., preferably for 1 hr to 10 hr, and more preferably for 4 hr to 6 hr, so as to grow a polysilicon film 1 by means of solid phase epitaxy preferably to a thickness of about 50 nm to 200 nm, and more preferably of about 100 nm. In this process, the solid phase epitaxy may be performed by means of a heat treatment using RTA (rapid thermal anneal) or a laser heat treatment using an excimer laser or the like.

When the polysilicon film 1 is grown in the above process, a group V impurity such as Sb (antimony), As (arsenic), or P (phosphorus), may be lightly doped into the polysilicon film 1 by means of implantation or the like. In the case where the TFT 30 is formed so as to be of the p-channel type, a group III impurity such as B (boron), Ga (gallium), or In (indium), may be lightly doped by means of implantation or the like. Instead of growing the polysilicon film 1 from the amorphous silicon film, the polysilicon film 1 may be directly grown by means of a reduced pressure CVD technique or the like. Alternatively, after forming a polysilicon film using reduced pressure CVD or the like, the polysilicon film may be converted into an amorphous form by implanting silicon ions into the polysilicon film, and the resultant amorphous silicon film may be recrystallized by means of a heat treatment thereby forming the polysilicon film 1. After forming the polysilicon film 1, the polysilicon film 1 is patterned into a semiconductor layer 1a which will serve as a first capacitor electrode 1f, a source region, a drain region, and a channel region.

Figure 2B:
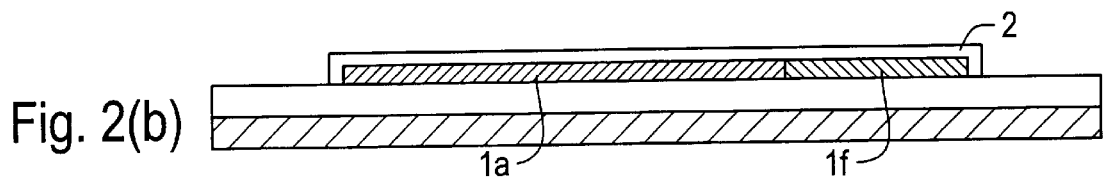

Then in the next step 2, as shown in FIG. 2(b), a first insulating thin film 2 is formed on the semiconductor layer 1*a* of the TFT 30 and on the first capacitor electrode 1*f*. The formation of the first insulating thin film 2 may be accomplished by thermally oxidizing the semiconductor layer 1*a* and the first capacitor electrode 1*f* preferably at a temperature of about 900° C. to 1300° C., and more preferably at about 1000° C. Alternatively, a thermal oxide film with a relatively small thickness of about 30 nm may be first formed on the semiconductor layer 1*a* and the first capacitor electrode 1*f* by means of thermal oxidation, and then an insulating film such as a high-temperature silicon oxide (HTO) film or silicon nitride film with a relatively large thickness of about 50 nm may be deposited by means of reduced pressure CVD or the like, so as to form the first insulating film 2 into a multilayer structure such as a two-layer film. In any method, the semiconductor layer 1*a* and the first capacitor electrode 1*f* are formed to have a thickness in the range of about 30 nm to 150 nm, and more preferably, in the range of about 35 nm to 50 nm, and the first insulating thin film 2 is formed to have a thickness in the range of about 20 nm to 200 nm, and more preferably, in the range of 30 nm to 100 nm. In the case where the first insulating thin film 2 is formed into the multilayer structure such as a two-layer structure, the thermal oxide film can be formed in a shorter time, and thus the TFT array substrate 10 is prevented from encountering bowing due to the high-temperature process.

A resist layer may be formed on the semiconductor layer 1*a* except for the area which will become the first capacitor electrode 1*f*, and then P ions or the like may be doped at a dose of about $3 \times 10^{12}/cm^2$ so as to reduce the resistance of the first capacitor electrode 1*f*.

Then in the next step 3, as shown in FIG. 2(*c*), a polysilicon film is deposited by means of reduced pressure CVD or the like, and the polysilicon film is doped with P by means of thermal diffusion, thereby converting the polysilicon film so as to have an electrically conductivity. Alternatively, a polysilicon film with a low resistance may be formed by introducing P ions simultaneously when the polysilicon film is formed. The polysilicon film is preferably formed to have a thickness in the range from about 100 nm to 500 nm, and more preferably, a thickness of about 300 nm. Furthermore, the polysilicon film is patterned into a scanning line 3*a* with a width greater than a final value, and also into a second capacitor electrode 3*b*, thereby forming the second capacitor electrode via the first capacitor electrode 1*f* and the first insulating thin film 2, and thus forming a first storage capacitor.

In the case where the TFT 30 is produced in the form of an n-channel type TFT having LDD regions, a group V element of impurity such as phosphorus is implanted, in step 4, as shown in FIG. 2(*d*), into the semiconductor layer 1*a* to a dose of 0.5 to $5.0 \times 10^{13}/cm^2$ using the gate electrode formed of a part of the scanning line 3*a* as a mask so as to form a low concentration source region 1*b* and a low concentration drain region 1*c*. In the case where the TFT 30 is formed so as to be of the p-channel type, a group III element of impurity such as boron is implanted. After completion of this step, a channel region 1*a'* is formed in the semiconductor layer 1*a* immediately below the gate electrode.

Then in step 5, as shown in FIG. 2(*e*), to form a high concentration source region 1*d* and a high concentration drain region 1*e* of the TFT 30, a resist layer 600 with a width greater than the width of the scanning line 3*a* is formed over the scanning line 3*a*, and a group V element of impurity such as phosphorus for the n-channel TFT or a group III element of impurity such as boron for the p-channel TFT is implanted into the semiconductor layer 1*a* to a dose of, for example, 0.5 to $5.0 \times 10^{15}/cm^2$. After completion of this step, the regions in the semiconductor layer 1*a* immediately below the resist layer 600 become a low concentration source region 1*b* and a low concentration drain region 1*c*, respectively.

Then in step 6, as shown in FIG. 2(*f*), after removing the resist layer 600, a second insulating thin film 81 is formed by thermally oxidizing the surfaces of the scanning line 3*a* and the second capacitor electrode 3*b*. More specifically, the surface of the polysilicon film serving as the scanning line 3*a* and that serving as the second capacitor electrode 3*b* is thermally oxidized at a temperature in the range of, for example, 900° C. to 1200° C. This technique allows the second insulating thin film 81 to be easily formed so as to have a rather small thickness, a high breakdown voltage, and a low defect density.

When the gate electrode formed of the polysilicon is oxidized in this step 6, after doping the impurity into the semiconductor layer 1*a* using the gate electrode having the width greater than the final value as the mask, in step 4, the external dimension of the polysilicon film becomes smaller, and thus the width of the scanning line 3*a* including the gate electrode and the width of the second capacitor electrode 3*b* decrease. The reduction in the width of the gate electrode results in the formation of undoped regions between the edges of the doped regions and the edges of the width of the channel region.

Therefore, at the stage after completion of step 6, an offset region 1*g* is formed directly adjacent each end of the channel region, wherein the size of the offset region 1*g* depends on the thickness of the second insulating thin film 81 formed on the side walls of the gate electrode. In view of the above, in the case where the scanning line 3*a* and the second capacitor electrode 3*b* are oxidized, it is desirable that the initial width of the scanning line 3*a* and that of the second capacitor electrode 3*b* be set to values several ten nm to several hundred nm wider than the final values, taking into account the reduction of the side walls of the scanning line 3*a* and the second capacitor electrode 3*b* caused by the oxidation.

In the present embodiment, the impurity doped in the semiconductor layer 1*a* is activated when the second insulating thin film 81 is formed in step 6. That is, a heat treatment for activating the impurity so as to lay impurity atoms at substitutional lattice sites of the crystal is performed simultaneously when the thermal oxide serving as the second insulating thin film 81 is formed. This allows the production process to be performed in a more efficient fashion.

Alternatively, in step 6, the second insulating thin film 81 may be formed into a multilayer structure by depositing, on the second insulating thin film 81, a further insulating film of high-temperature silicon oxide (HTO) or silicon nitride with a rather small thickness of about 200 nm or less by means of reduced pressure CVD, or plasma-enhanced CVD, or the like. In this case, because the capacitance of the second storage capacitor becomes greater if the thickness of the second insulating thin film 81 is reduced, it is desirable to form the second insulating thin film 81 to have a very small thickness which is less than the thickness of the first insulating thin film 2, and more specifically, less than 50 nm, provided that there are substantially no defects such as pinholes.

Then in step 7, as shown in FIG. 2(*g*), a contact hole 8*a*, through which a conductive layer 80*a* and the high concentration drain region 1*e* will be electrically connected to each other, is formed in the first insulating thin film 2 by means of dry etching, such as reactive ion etching or reactive ion beam etching. In this step, high directivity of the dry etching process allows the contact hole 8a to be formed so as to have a small diameter. Alternatively, a combination of dry etching and wet etching may be employed to form the contact hole 8a. In this case, it becomes easy to precisely form the contact hole 8a without resulting in an over-etching which would cause the contact hole 8a to further extend through semiconductor layer 1a. Wet etching is also advantageous in that the contact hole 8a formed by wet etching has a tapered shape which allows a better electrical connection to be achieved. A contact hole 8a' used to connect the conductive layer 80b to the high concentration source region 1d may also be formed at the same time as the contact hole 8a.

Figure 2C:
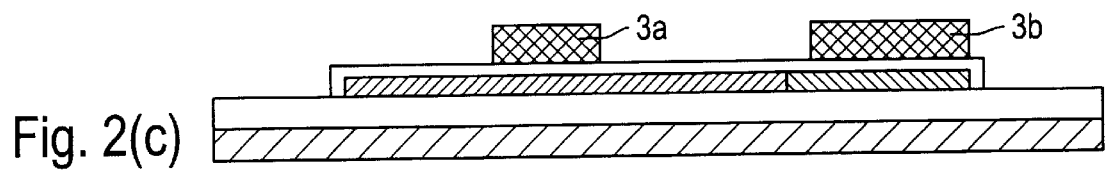
Figure 2D:
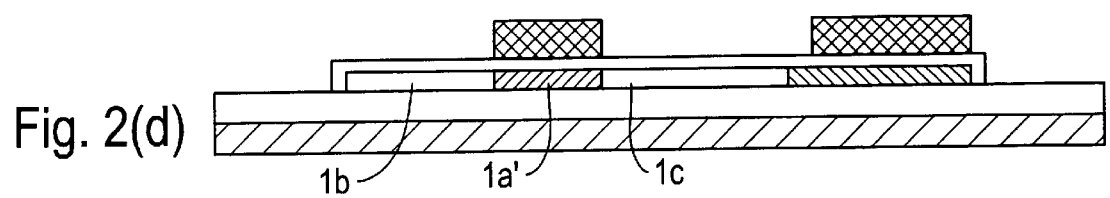
Figure 2E:
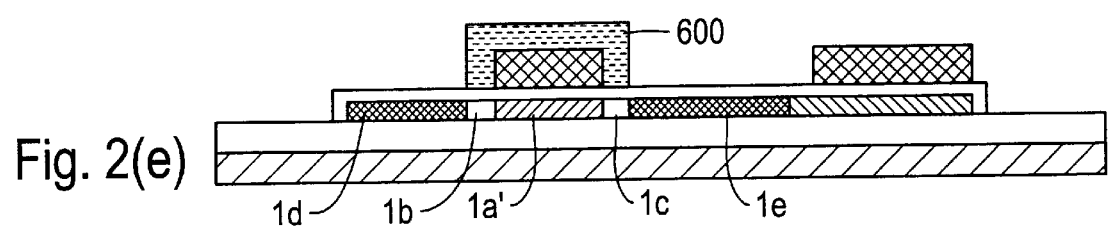
Figure 2F:
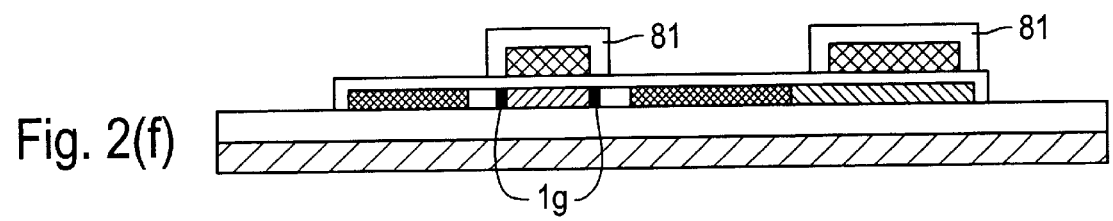
Figure 2G:
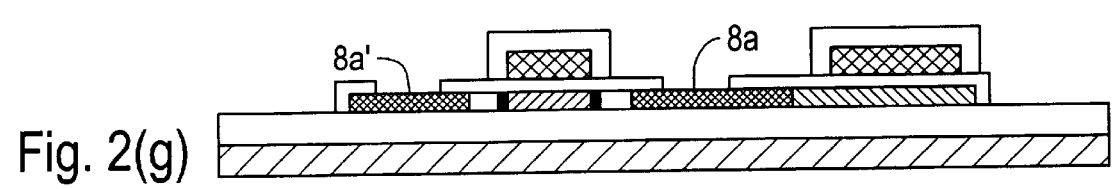
Figure 2H:
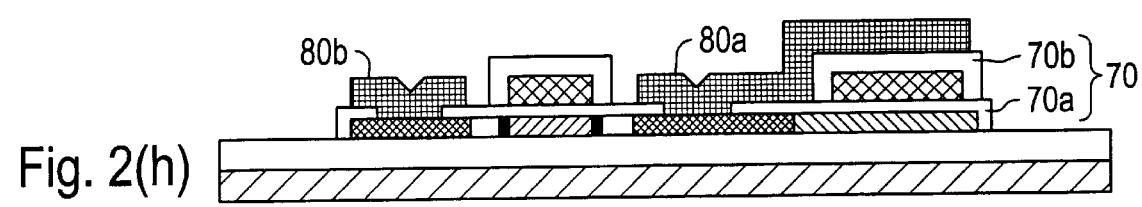

Then in step 8, as shown in FIG. 2(h), a film of a metal such as Al, Ti, Cr, W, Ta, Mo, Cu, or Pb or an alloy such as a metal silicide, is deposited by means of sputtering or the like over the entire area of the high concentration drain region 1e via the second insulating thin film 81 and via the contact hole 8a. After that, the film is patterned by means of photolithography and etching to form a conductive layer 80a including a third capacitor electrode. In this step, a conductive layer 80b may also be formed simultaneously. Herein, the thickness of the conductive layers 80a and 80b are selected to be in the range of, for example, 50 nm to 500 nm. If the thickness is greater than 50 nm, there is substantially no possibility that a contact hole will be etched further through the conductive layer 80a or 80b during the process of forming the contact hole in a film which will be formed on the conductive layer 80a or 80b. A polysilicon film or the like may be formed on the conductive layer 80a so as to serve as an antireflection film for reducing surface reflection. In order to mitigate stress, the conductive layer 80a may be formed using a polysilicon film or the like with a low resistance. In this case, the conductive film 80a may be formed in a multilayer structure consisting of two or more layers in which a polysilicon film with a low resistance (electrically conductive polysilicon film) is disposed at the bottom and a metal film is disposed thereon. In the case where the conductive film 80a is formed in a three-layer structure, a metal film may be disposed between polysilicon films at the top and bottom. If both the conductive film 80a and the high concentration drain region 1e are formed of polysilicon film, it is possible to greatly reduce electrical contact resistance between them. Furthermore, in the present embodiment, the conductive layers 80a and 80b may also be used as a bit line or a gate line.

In the production process according to the present embodiment, as described above, because the scanning line 3a, and the second storage capacitor electrode 3b are formed of the polysilicon film, and the second insulating thin film 81 is formed by thermally oxidizing the polysilicon film, it is possible to achieve a high-quality interface having good uniformity and good adherence between the second insulating thin film 81 and the scanning line 3a, and also between the second insulating thin film 81 and the second capacitor electrode 3b. Thus, the semiconductor device production method according to the present embodiment allows the second insulating thin film 81 to be formed so as to have a small thickness and a high breakdown voltage using a small number of simple steps. Furthermore, because a first storage capacitor 70a is formed of the first capacitor electrode 1f and the second capacitor electrode 3b, and a second storage capacitor 70b is formed between the second capacitor electrode 3b and a third capacitor electrode formed of a part of the conductive layer 80a, it is possible to achieve an increased value of the storage capacitance.

Furthermore, in step 4 in which the impurity is low concentration, the impurity can be implanted using as a mask the gate electrode formed of a part of the scanning line 3a without needing a photolithography process. Furthermore, because the second insulating thin film 81 serving as the second dielectric film is formed by oxidizing the surface of the scanning line 3a in step 6, the side walls of the gate electrode formed of a part of the scanning line 3a is partly removed during the oxidation process, and thus, the offset region 1g in which no impurity is doped in the semiconductor layer 1a is formed. Thus, it is possible to realize a semiconductor device including a TFT having offset regions and LDD regions, and also including a storage capacitor with large capacitance, using the production process consisting of a less number of steps associated with the photolithography process. It is also possible to suppress variations in characteristics caused by an alignment error of an exposure apparatus in the photolithography process, and thus, it is possible to form the TFT 30 so as to have a shorter channel length, which allows a reduction in the size of the semiconductor device.

In the production process described above, the steps following the step 6 for forming the oxide film steps may be performed in an ambience at a temperature equal to or lower than 400° C. In this case, materials having low heat resistance may be used to form conductive layers or insulating films in the steps after forming the second insulating thin film 81.

Instead of employing thermal oxidation to form the second insulating thin film 81 in step 6 in the production process described above, the second insulating thin film 81 may be formed by anodizing the surfaces of the scanning line 3a and the second capacitor electrode 3b. In this case, it is required that the scanning line 3a and the second capacitor electrode 3b be formed of an anodizable metal such as Ta (tantalum) or Al (aluminum). If anodization is employed, the resultant oxide film has a good interface, in terms of uniformity and adherence, with the scanning line 3a and the second capacitor electrode 3b. Furthermore, the oxide film formed by anodization is also advantageous in that it can be used as a thin insulating film having a high breakdown voltage and a low density of defects. In particular, when a tantalum oxide film is formed by anodizing tantalum, the resultant insulating film has a high dielectric constant of about 21.7 in contrast to the silicon oxide film having a dielectric constant of about 3.9. Thus, if the tantalum oxide film is employed, it is possible to achieve a greater storage capacitance under the same design rules.

In the present embodiment, as described above, the TFT is formed so as to have the offset regions and the LDD regions using the small number of steps. However, step 4 for lightly doping an impurity into the semiconductor layer 1a may be skipped so as to form a TFT 30 having offset regions but having no LDD regions.

FIGS. 3(a)–(h) are schematic diagrams illustrating the steps of producing a semiconductor device, according to a second embodiment.

Figure 3A:
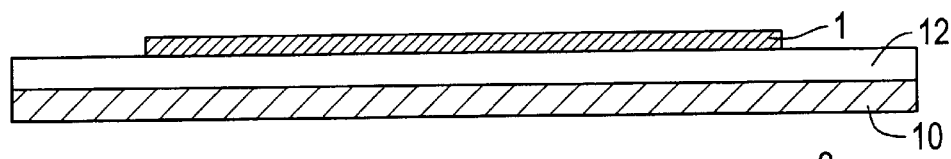
FIGS. 3(a)–(h) are schematic sectional views illustrating the steps of producing a semiconductor device, according to a second exemplary embodiment.
Figure 3B:
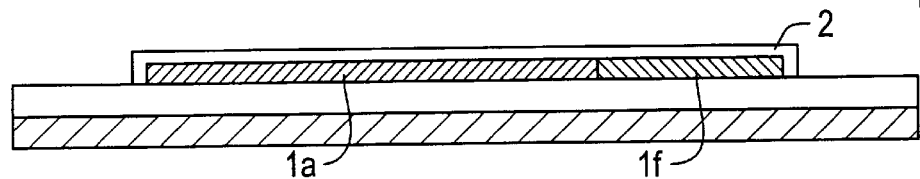
Figure 3C:
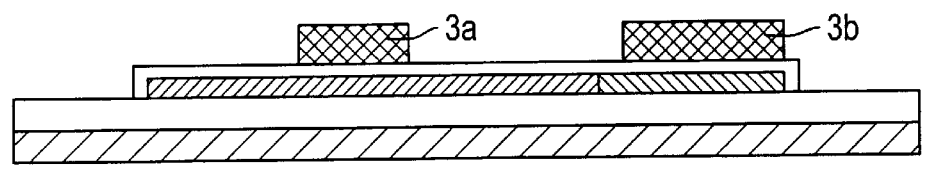

Steps 1–3 in this second embodiment, as shown in FIGS. 3(a)–(c) are the same as steps 1–3 in the first embodiment, as shown in FIGS. 2(a)–(c), and thus they are not described in further detail herein. However, step 4 and the following steps of this second embodiment are described below with reference to FIGS. 3(d)–(h).

Figure 3D:
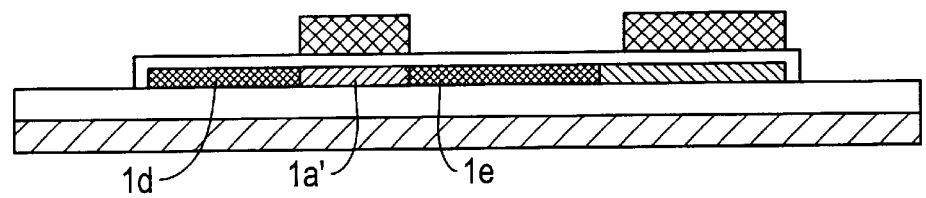

In step 4, as shown in FIG. 3(d), an impurity is doped into the semiconductor layer 1a to a high concentration using the gate electrode as a mask, wherein the gate electrode is formed of a part of the scanning electrode 3a having a width greater than a final value. More specifically, P ions are implanted to a dose of 0.5 to $5.0 \times 10^{15}/cm^2$ for n-channel TFTs, and B ions are implanted for p-channel TFTs.

Figure 3E:
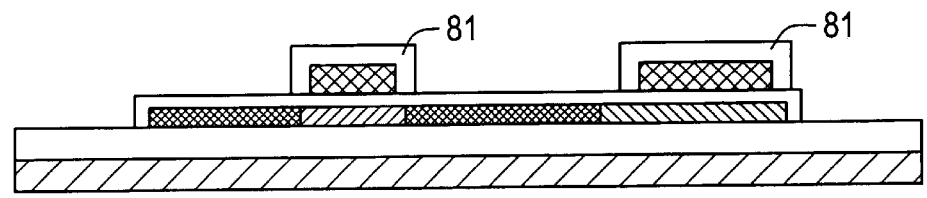

In the next step 5, as shown in FIG. 3(e), the surfaces of the scanning line 3a and the second capacitor electrode 3b having the width greater than the final value are thermally oxidized at a temperature of, for example, 900° C. to 1200° C., thereby forming a second insulating thin film 81. Thus, as in the first embodiment, the scanning line 3a and the second capacitor electrode 3b formed of polysilicon film are oxidized in step 5 after doping the impurity into the semiconductor layer 1a in step 4, and thus, the size of the oxidized polysilicon film is reduced by the oxidation. As a result, the width of the gate electrode formed of the part of the scanning line 3a is also reduced. The reduction in the width of the gate electrode results in formation of undoped regions between the edges of the doped regions and the edges of the gate electrode in the direction of the width of the channel region. In view of the above, it is desirable that the initial width of the scanning line 3a be set to a value several ten nm to several hundred nm greater than the final value, taking into account the reduction of the side walls of the scanning line 3a caused by the oxidation.

In the present embodiment, as in the first embodiment, the impurity doped in the semiconductor layer 1a is activated when the second insulating thin film 81 is formed in step 5. The second insulating thin film 81 may also be formed into a multilayer structure as described above in the first embodiment.

Figure 3F:
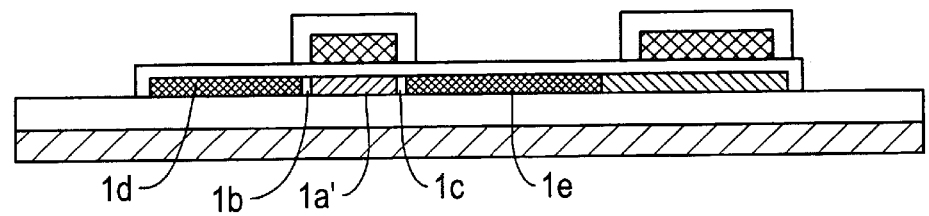

Then in the next step 6, as shown in FIG. 3(f), an impurity is implanted at an acceleration energy which is selected, taking into account the vertical thickness of the second insulating thin film 81 formed on the side walls of the gate electrode, such that portions of the semiconductor layer 1a immediately below the second insulating thin film 81 are lightly doped with the impurity, thereby forming a low concentration source region 1b and a low concentration drain region 1c. More specifically, P ions are implanted to a dose of 0.5 to $5.0 \times 10^{13}/cm^2$ for n-channel TFTs, and B ions are implanted for p-channel TFTs.

Figure 3G:
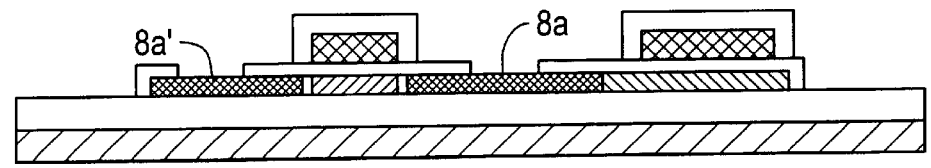
Figure 3H:
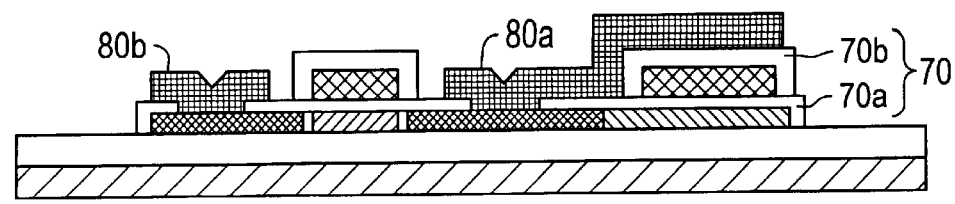

Then steps 7 and 8, as shown in FIGS. 3(g) and 3(h), respectively, are performed. They are similar to those in the first embodiment, and thus they are not described in further detail herein.

In the present embodiment, step 6 for lightly doping the impurity may also be performed after step 7 or 8.

According to the production process of the present embodiment, as described above, it is possible to obtain a high-quality interface having good uniformity and good adherence between the scanning line 3a formed of the polysilicon film and the second insulating thin film 81 formed by thermally oxidizing the polysilicon film, and also between the second capacitor electrode 3b and the second insulating thin film 81. Therefore, according to the production method of the present embodiment, it is possible to produce a semiconductor device having a second insulating thin film 81 with a small thickness, a low density of defects, and a high breakdown voltage, using a simple process including a small number of steps.

In step 4 for implanting a high-concentration of impurity, the impurity is doped without needing a photolithography process, because the gate electrode formed of the part of the scanning line 3a is used as the mask. Also in step 6 for forming the LDD regions by lightly doping the impurity, the impurity is doped without needing a photolithography process such that the TFT 30, including the low concentration source region 1b and the low concentration drain region 1c, is formed at locations corresponding to the side walls of the scanning line 3a so as to have a width substantially equal to the thickness of the second insulating thin film. Because no photolithography process is required in these steps, it is also possible to eliminate variations in characteristics which would otherwise occur due to an alignment error of an exposure apparatus in the photolithography process, and thus, it is possible to form the TFT so as to have a shorter channel length. Another advantage of the present embodiment is that, unlike the first embodiment, the step using the resist layer 600 which can cause an alignment error is not required, and thus number of steps is further reduced.

In the production process described above, the steps after forming the oxide film in step 5 may be performed in an ambience at a temperature equal to or lower than 400° C. In this case, materials having low heat resistance may be used to form conductive layers or insulating films in the steps after forming the second insulating thin film 81. Instead of employing thermal oxidation to form the second insulating thin film 81 in step 5 in the production process described above, the second insulating thin film 81 may be formed by anodizing the surfaces of the scanning line 3a and the second capacitor electrode 3b. In this case, it is required that the scanning line 3a and the second capacitor electrode 3b be formed of an anodizable metal such as Ta (tantalum) or Al (aluminum). If the second insulating thin film 81 is formed of a tantalum oxide film, the resultant insulating thin film has a high dielectric constant as described above with reference to the first embodiment.

In the present embodiment, as described above, the TFT is formed so as to have the LDD regions using the small number of steps. However, step 6 for lightly doping an impurity into the semiconductor layer 1a may be skipped so as to form a TFT having offset regions but having no LDD regions.

Figure 4A:
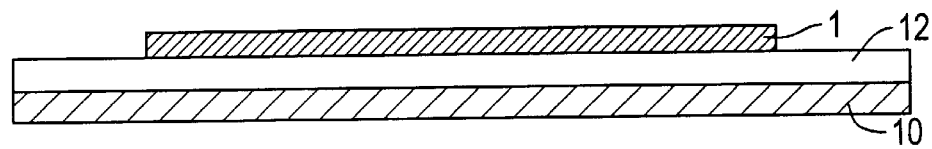
FIGS. 4(a)–(h) are schematic sectional views illustrating the steps of producing a semiconductor device, according to a third exemplary embodiment.
Figure 4B:
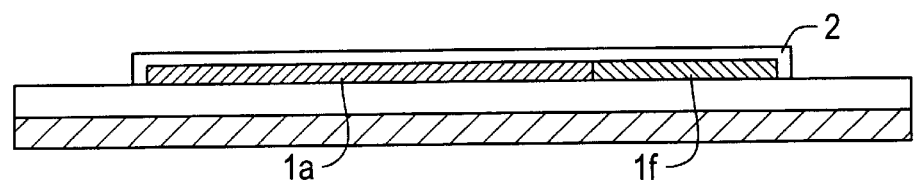
Figure 4C:
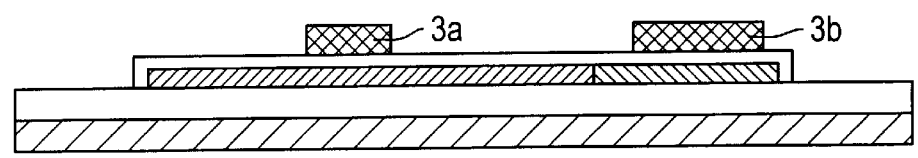

A third embodiment is described below with reference to FIGS. 4(a)–(h). Steps 1–3, as shown in FIGS. 4(a)–(c), in this third embodiment are similar to steps 1–3 in the first embodiment, as shown in FIGS. 2(a)–(c), and thus, they are not described in further detail herein.

Figure 4D:
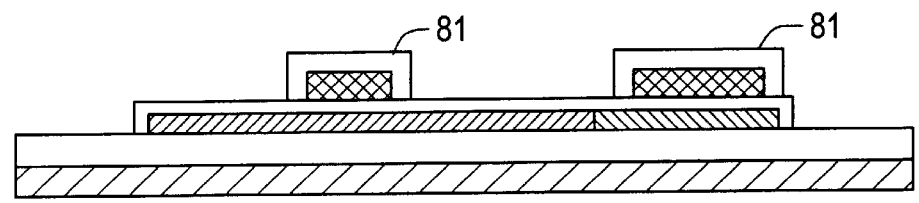

In this embodiment, before doping an impurity, a second insulating thin film 81 is formed in step 4, as shown in FIG. 4(d), by thermally oxidizing the surface of the scanning line 3a having a width greater than a final value and the surface of the second capacitor electrode 3b. More specifically, the surfaces of the scanning line 3a and the second capacitor electrode 3b, each formed of polysilicon film, are thermally oxidized at a temperature in the range of, for example, 900° C. to 1200° C., thereby forming a relatively thin oxide film having a high breakdown voltage and a low density of defects.

Figure 4E:
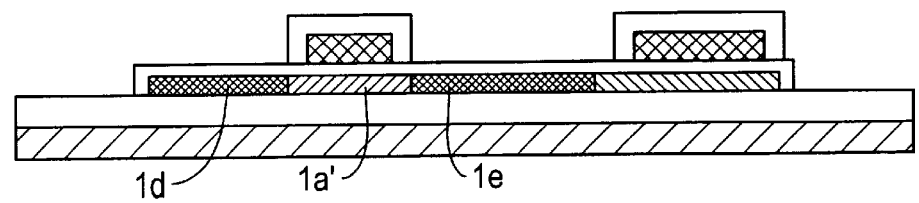
Figure 4F:
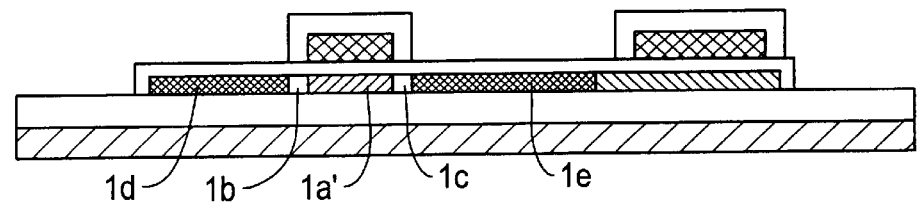
Figure 4G:
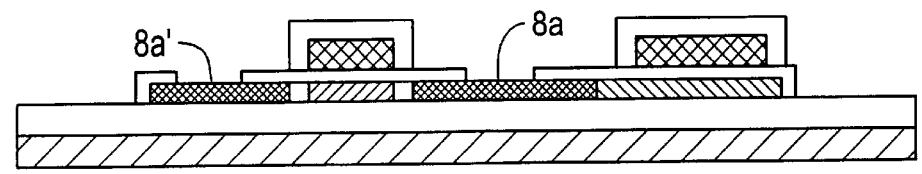
Figure 4H:
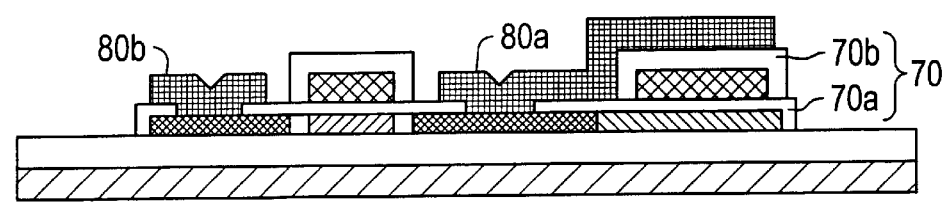

Then in step 5, as shown in FIG. 4(e), a high concentration of impurity is implanted, from above the scanning line 3a and the second insulating thin film 81, into the semiconductor layer 1a to a dose of 0.5 to $5.0 \times 10^{15}/cm^2$, wherein phosphorus, for example, is employed as the impurity for the n-channel TFT, and boron, for example, is employed for the p-channel TFT. In this process of doping the impurity into the semiconductor layer 1a, the gate electrode formed by a part of the scanning line 3a serves as a mask, and thus the region of the semiconductor layer 1a, immediately below the gate electrode is not doped with the impurity. Furthermore, no impurity is doped also in regions of the semiconductor layer 1a immediately below the second insulating thin film 81 formed on the side walls of the gate electrode, because the thickness of the second insulating thin film 81 on the side walls of the gate electrode serves as a mask.

In the next step 6, as shown in FIG. 4(*f*), a high concentration of impurity is implanted, from above the scanning line 3*a* and the second insulating thin film 81, into the semiconductor layer 1*a* at an acceleration energy which is selected taking into account the vertical thickness of the second insulating thin film 81 formed on the side walls of the gate electrode, such that portions of the semiconductor layer 1*a* immediately below the second insulating film 81 are lightly doped with the impurity, thereby forming a lightly doped source region 1*b* and a lightly doped drain region 1*c*. In this process, for example, P ions are implanted to a dose of 0.5 to $5.0 \times 10^{13}/cm^2$ for n-channel TFTs, and B ions are implanted for p-channel TFTs.

Herein, if step 6 is skipped, the TFT 30 will have only offset regions. A heat treatment is then performed to activate the semiconductor layer 1*a*. Step 5 described above may be performed after step 6.

Then steps 7 and 8, as shown in FIGS. 4(*a*) and 4(*h*), respectively, are performed. They are similar to those in the first embodiment, and thus they are not described in further detail herein. The heat treatment for activating the semiconductor layer 1*a* may be performed after step 7 or 8.

In the present embodiment, because the offset regions and the LDD regions are formed without using the photolithography process, it is possible to eliminate a reduction in production yield which would occur during the photolithography process. Furthermore, the LDD regions (or offset regions) are formed in the TFT by means of a self-alignment technique using the gate electrode and the second insulating thin film 81 as a mask, and variations in characteristics are eliminated which would otherwise occur due to an alignment error of an exposure apparatus in the photolithography process. The self-alignment technique also makes it possible to realize a TFT with a very short channel.

Although in the present embodiment, the second insulating thin film 81 is formed by oxidizing the scanning line 3*a* and the second capacitor electrode 3*b* as in the first and second embodiments, the second insulating thin film 81 may also be formed in other manners without oxidizing the scanning line 3*a* and the second capacitor electrode 3*b*. For example, after forming the scanning line 3*a* and the second capacitor electrode 3*b*, the second insulating thin film 81 may be deposited by means of atmospheric CVD, reduced pressure CVD, plasma-enhanced CVD, ECR deposition, or remote plasma CVD. If the steps after that are performed in a similar manner as described above, then the TFT 30 is obtained. In this case, the scanning line 3*a* and the second capacitor electrode 3*b* are not resized, and the size of the LDD regions (or offset regions) is determined by the thickness of the second insulating thin film deposited.

(Construction of Electro-optical Apparatus)

Figure 5:
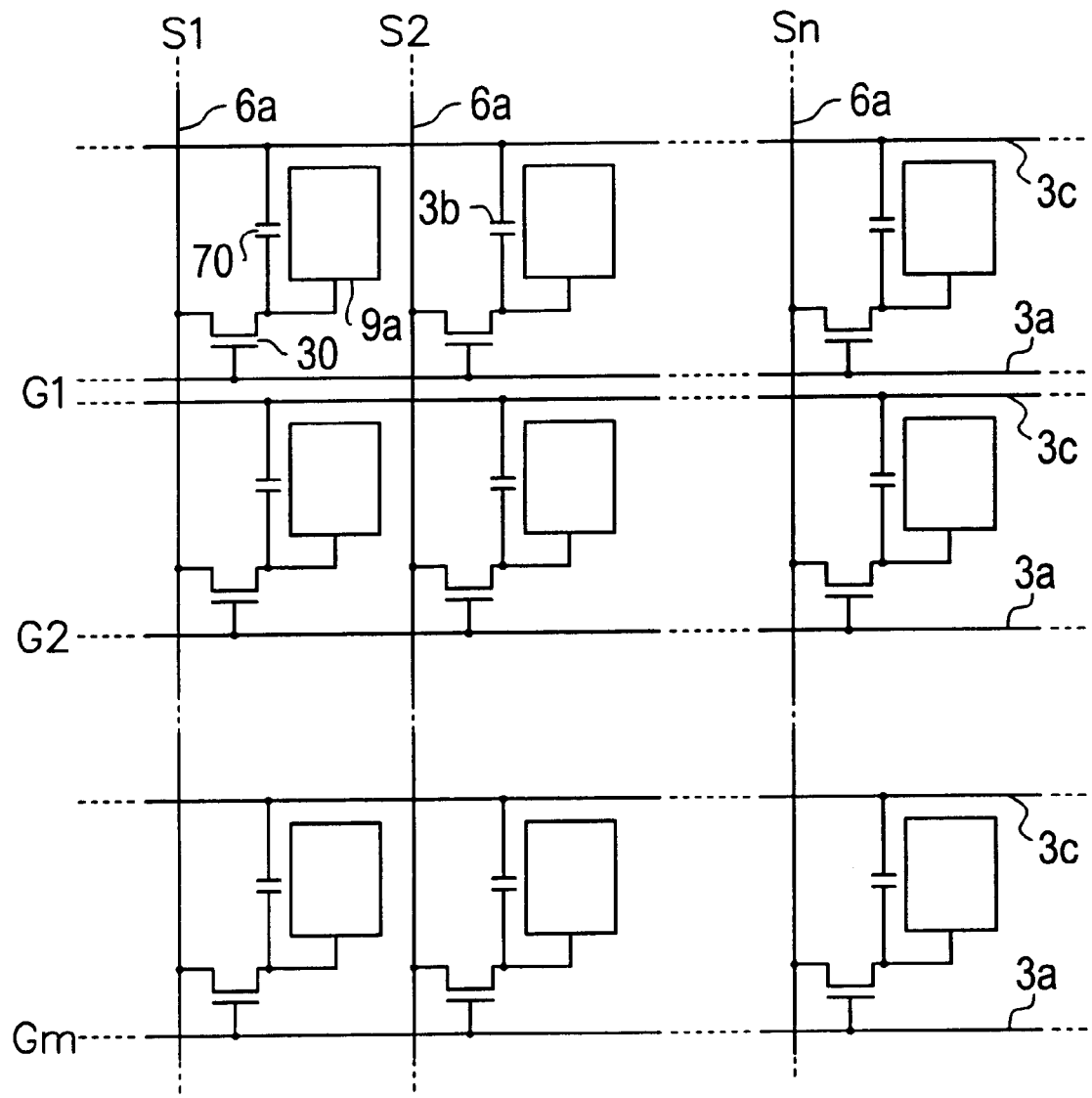
FIG. 5 is an equivalent circuit diagram illustrating various elements of pixels disposed in the form of a matrix and interconnections, in an image display area of the electro-optical device according to an exemplary embodiment.
Figure 6:
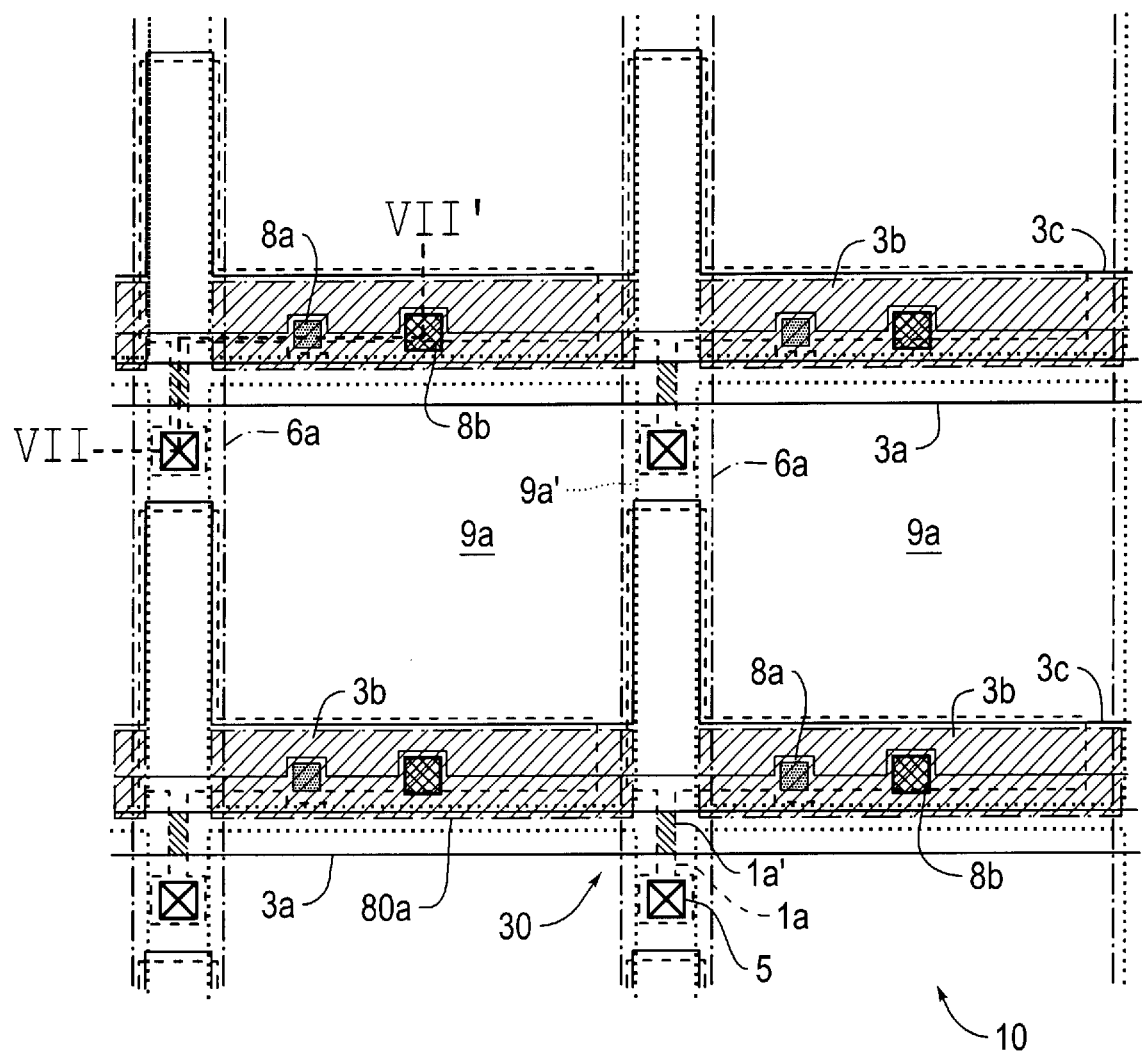
FIG. 6 is a plan view illustrating a plurality of adjacent pixels on a TFT array substrate on which data lines, scanning lines, and pixels electrodes are formed according to an exemplary embodiment of an electro-optical device.
Figure 7:
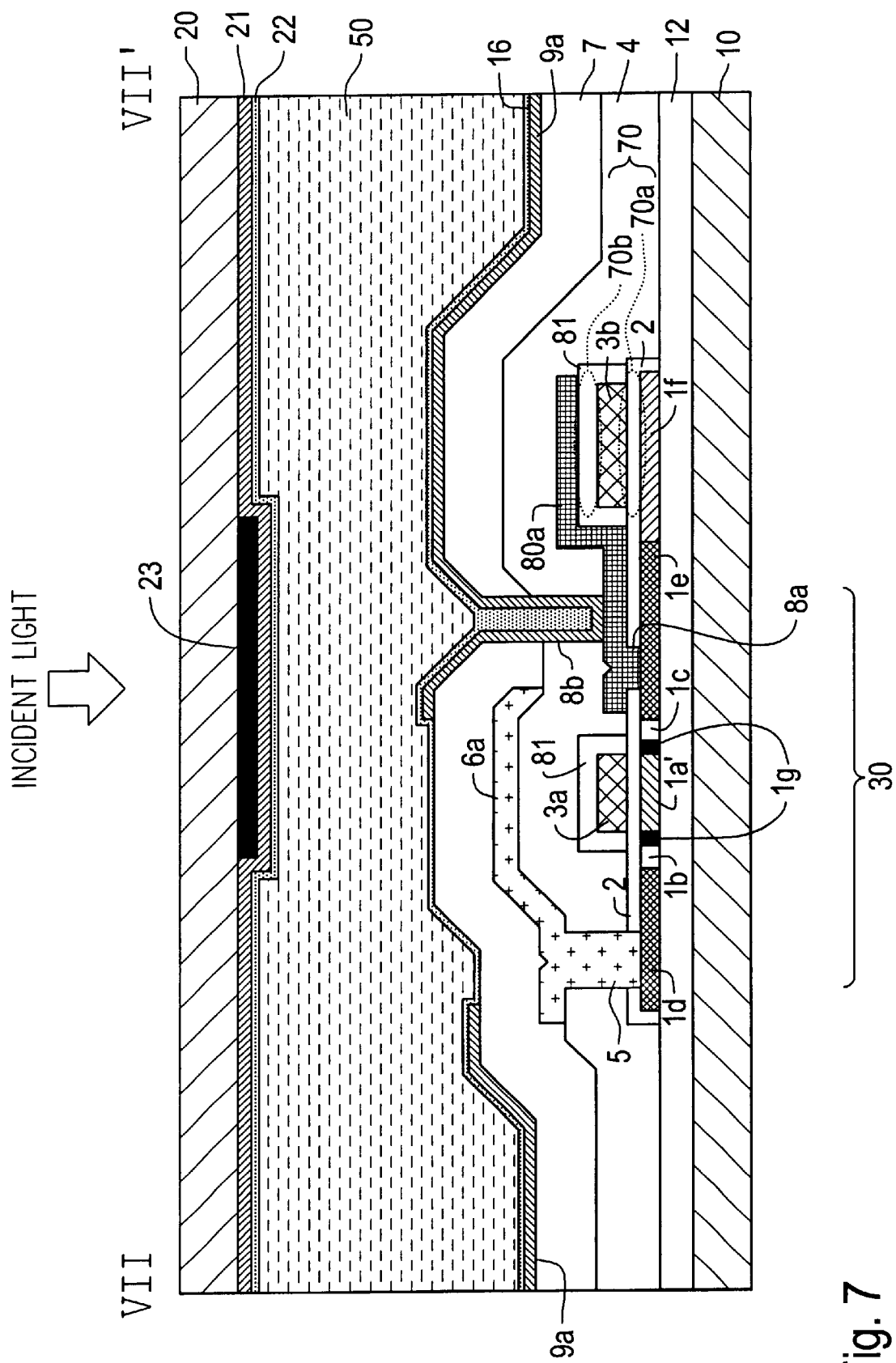
FIG. 7 is a cross-sectional view taken along line VII–VII' of FIG. 6.
Figure 8:
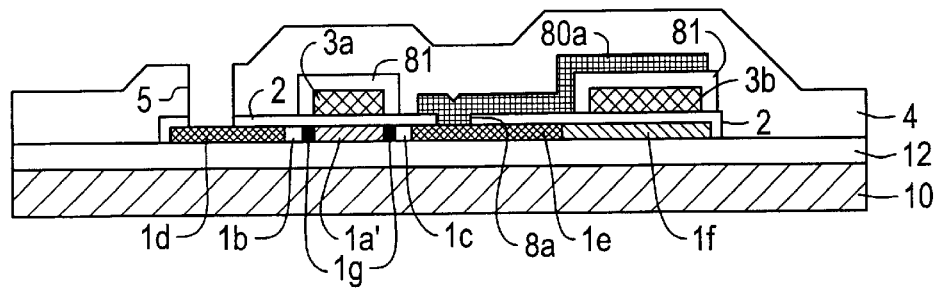
FIGS. 8(a)–(d) are cross-sectional views illustrating steps of producing an electro-optical device.
Figure 8:
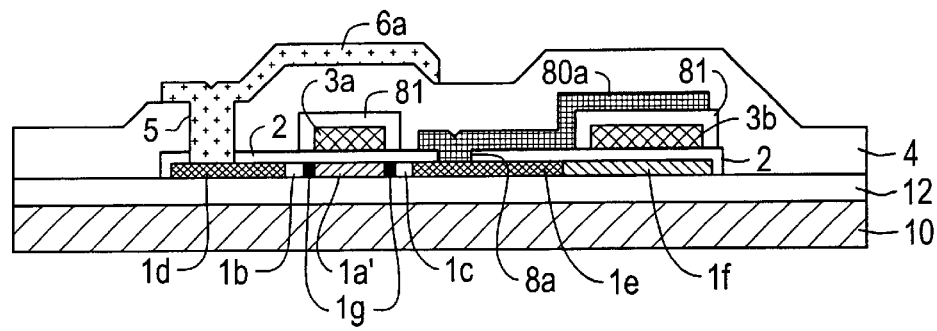
Figure 8:
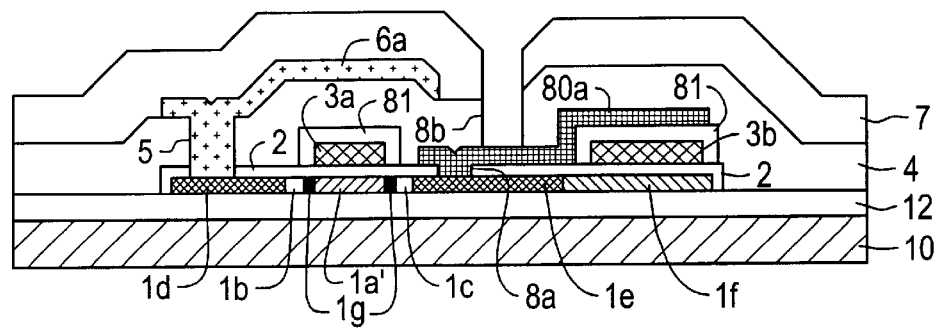
Figure 8:
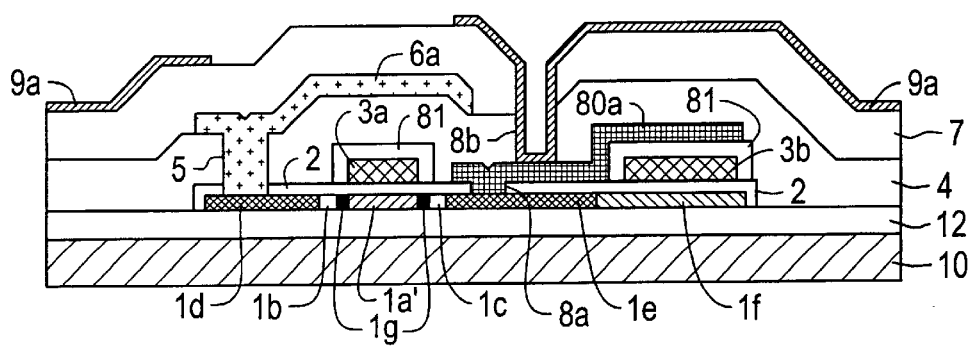

As an example of an electro-optical device having the above-described semiconductor device disposed on a substrate, a liquid crystal device is described below with reference to FIGS. 5–7. FIG. 5 illustrates an equivalent circuit of pixels of the liquid crystal device. FIG. 6 is a plan view illustrating some adjacent pixels of the liquid crystal device. FIG. 7 is a cross-sectional view taken along line VII–VII' of FIG. 6.

In FIG. 5, an image displaying area of the liquid crystal device of the present embodiment is formed of a plurality of pixels disposed in the form of a matrix. Each pixel includes a pixel electrode 9*a* and a TFT 30 for controlling the pixel electrode 9*a*. A data line 6*a* for supplying an image signal is electrically connected to the source of the TFT 30. A scanning line 3*a* is electrically connected to the gate of the TFT 30. Scanning signals G1, G2, . . . , and Gm in the form of pulses are supplied over the scanning line 3*a* in accordance with predetermined timing. The pixel electrode 9*a* is electrically connected to the drain region of the TFT 30 so that when the TFT 30 serving as a switching device is closed for a predetermined period of time, image signals S1, S2, . . . , Sn supplied via the data line 6*a* are written into the pixel. The image signals S1, S2, . . . , Sn with particular signal levels are maintained for a predetermined period of time in the liquid crystal between the pixel electrode 9*a* and an opposite electrode formed on an opposite substrate (which will be described in later). In order to prevent leakage of the image signals, a storage capacitor 70 is added in parallel to liquid crystal capacitance formed between the pixel electrode 9*a* and the opposite electrode.

FIG. 6 is a plan view illustrating exemplary adjacent pixels corresponding to those shown in the equivalent circuit of FIG. 5. In FIG. 6, a plurality of transparent pixel electrodes 9*a* (whose outline is represented by broken lines 9*a*') are disposed in the form of a matrix on a TFT array substrate 10 of the liquid crystal device, and data lines 6*a*, scanning lines 3*a*, and capacitor lines 3*c* are disposed along the vertical and horizontal boundaries between adjacent pixels 9*a*. Each source region of the semiconductor layer 1*a* formed of the polysilicon film is electrically connected to one data line 6*a* via a contact hole 5. Each pixel electrode 9*a* is electrically connected to the corresponding drain region of the semiconductor layer 1*a* via a conductive layer 80*a* formed in an area hatched with lines diagonal from lower left to upper right in FIG. 6, and further via contact holes 8*a* and 8*b*. The scanning lines 3*a* are disposed at locations corresponding to the channel regions 1*a*' (hatched with lines diagonal from upper left to lower right in FIG. 6) so that the scanning lines 3*a* also serve as gate electrodes. TFTs 30 are disposed at the respective intersections of the scanning lines 3*a* and the data lines 6*a*, wherein the gate electrode of each TFT 30 is realized by the scanning line 3*a* disposed above the channel region 1*a*' of the TFT 30.

Each capacitor line 3*c* includes a main part extending substantially linearly along a corresponding scanning line 3*a*, and also includes a branch extending along a data line 6*a* from an intersection between a data line 6*a* and the capacitor line 3*c* toward a previous stage (in a direction toward the top of the figure).

The conductive layers 80*a* are electrically connected to the corresponding drain regions of the semiconductor layers 1*a* via contact holes 8*a* and also to the corresponding pixel electrodes 9*a* via contact holes 8*b* so that the conductive layers 80*a* serve as a buffer between each high concentration drain region 1*e* of the semiconductor layer 1*a* and the corresponding pixel electrode 9*a*. If a first light-shielding film (not shown) is disposed such that at least the channel region 1*a* of each pixel switching TFT 30 is covered with the first light-shielding film when seen from the side of the TFT array substrate 10, it is possible to prevent the channel region 1*a*' of each TFT from being struck by a light ray reflected from the TFT array substrate 10, thereby preventing each pixel switching TFT 30 from having degradation due to a photocurrent.

As shown in the cross-sectional view of FIG. 7, the liquid crystal apparatus includes the TFT array substrate 10 serving as an example of a transparent substrate which is one of two substrates, and also includes an opposite substrate 20 serving as an example of the other transparent substrate disposed at a location opposing the TFT array substrate 10. The TFT array substrate 10 is made of, for example, a quartz substrate and the opposite substrate 20 is made of, for example, a glass substrate or a quartz substrate. Pixel electrodes 9a are formed on the TFT array substrate 10, and an alignment film 16 subjected to an aligning treatment such as a rubbing process is further formed thereon. The pixel electrodes 9a are made of a transparent conducting thin films such as ITO (indium tin oxide) films. The alignment film 16 is made of an organic thin film such as a polyimide thin film.

A light-shielding film 23 is formed on the opposite substrate 20. Furthermore, an opposite electrode 21 and an alignment film 22 subjected to an aligning treatment such as a rubbing process are formed over the entire surface of the opposite substrate 20. The opposite electrode 21 is made of a transparent conducting thin film such as an ITO film. The alignment film 22 is made of an organic thin film such as a polyimide thin film.

In the present embodiment, first storage capacitors 70a are formed as follows. That is, the semiconductor layers 1a are extended from the respective heavily doped drain regions 1e and used as the first storage capacitor electrodes 1f, parts of the capacitor lines 3b at corresponding locations overlapping the first storage capacitor electrode 1f are used as the second capacitor electrodes 3b, and the first insulating thin films 2 serving as the gate insulating films are extended from the locations opposing the scanning lines 3a so that the extended portions are used as the first dielectric films of the respective storage capacitors 70. The capacitor line 3c and the second capacitor electrode 3b may be formed using the same film as in the present embodiment, or the capacitor line 3c may be formed in a different layer and be electrically connected to the second capacitor electrode 3b in the form of an island. A part of the conductive layer 80a at a location opposite to the second capacitor electrode 3b is used as a third capacitor electrode to form a second storage capacitor 70b between this third capacitor electrode and the second capacitor electrode, wherein the second insulating thin film 81 between these electrodes serves as a second dielectric film. The first storage capacitor 70a and the second storage capacitor 70b are connected in parallel via the contact hole 8a, thereby forming a single storage capacitor 70.

In this technique, the first insulating thin film 2 is realized using the oxide film of the TFT 30 formed on the polysilicon film by means of high-temperature oxidation, and thus, it is possible to achieve a thin insulating film with a high breakdown voltage, long life and uniformity in film thickness. Therefore, it is possible to achieve a first storage capacitor 70a having a high capacitance using a rather small area.

(Method of Producing the Electro-optical Device)

A method of producing an electro-optical device according to the present embodiment is described below with reference to FIGS. 8(a)–(d). In the present embodiment, the TFT 30 (a pixel switching TFT in the present embodiment) and the storage capacitor 70 may also be formed in accordance with the semiconductor device production method described above.

FIGS. 8(a)–(d) are cross-sectional views illustrating the steps of producing the electro-optical device. Steps 1–8 of the present embodiment may be performed in a similar manner to those described above with reference to the first to third embodiments, and thus they are not described in further detail herein, and step 9 and the following steps are described below with reference to FIGS. 8(a)–(d).

In step 9, as shown in FIG. 8(a), a first interlayer insulating film 4 is formed of silicate glass film such as NSG, PSG, BSG, or BPSG, silicon nitride film, or silicon oxide film by means of atmospheric pressure CVD or reduced pressure CVD using TEOS gas or the like, so that the second dielectric film 81 and the conductive layer 80a are covered with the first interlayer insulating film 4. Preferably, the thickness of the first interlayer insulating film 4 is within the range from about 500 to 1500 nm. A contact hole 5 used to connect a data line 6a to the high concentration source region 1d is then formed through the first insulating thin film 2 and the first interlayer insulating film 4 by means of an etching process.

Next, in step 10, as shown in FIG. 8(b), an electrically conductive metal film such as an aluminum film serving as the data line 6a is deposited on the first interlayer insulating film 4 by means of sputtering or the like.

Then, in step 11, as shown in FIG. 8(c), a second interlayer insulating film 7 is formed on the data line 6a by means of CVD or the like in a manner similar to that for the underlying insulating film 12 and the first interlayer insulating film 4. A contact hole 8b is formed through the first interlayer insulating film 4 and the second interlayer insulating film 7 by means of etching.

Then in step 12, as shown in FIG. 8(d), an ITO film serving as the pixel electrode 9a is formed and patterned such that the pixel electrode 9a is electrically connected to the conductive layer 80a via the contact hole 8b. The data line 6a is preferably formed to have a thickness in the range from about 100 nm to 500 nm, and more preferably a thickness of about 300 nm. The second interlayer insulating film 7 is preferably formed to have a thickness in the range from about 500 nm to 1500 nm. The pixel electrode 9a is preferably formed to have a thickness in the range from about 50 nm to 200 nm. When the electro-optical device is used in a liquid crystal device of the reflective type, the pixel electrode 9a may be formed of an opaque material having high reflectance, such as aluminum.

In the case of the liquid crystal device, as described above, the data line 6a is formed on the conductive layer 80a via the first interlayer insulating film 4, the pixel electrode 9a is formed on the data line 6a via the second interlayer insulating film 7, and the high concentration drain region 1e is connected to the pixel electrode 9a via the conductive layer 80a. In the liquid crystal device, when the pixel electrode 9a is formed of, for example, an ITO film and the data line 6a is formed of an Al film having a low resistance, if the conductive layer 80a and the data line 6a are produced using the same film in the same production step, there is a possibility that the ITO film and the Al film are electrically corroded, and good electric connection cannot be obtained. To avoid the above problem, it is desirable to form the conductive layer 80a and the data line 6a using different materials in different layers. In this respect, the liquid crystal device according to the invention does not have the problem of electric corrosion, because the pixel electrode 9a is formed of the ITO film and connected to the drain regions 1e via the conductive layer 80a formed of a layer different from the data line 6a formed of the Al film.

According to the production process of the present embodiment, as described above, it is possible to obtain a high-quality interface having good uniformity and good adherence between the scanning line 3a formed of the polysilicon film and the second insulating thin film 81 formed by thermally oxidizing the polysilicon film, and also between the second capacitor electrode 3b and the second insulating thin film 81. That is, it is possible to form a dielectric film having a high breakdown voltage, a relatively small thickness, and a low density of defects. Furthermore, it is possible to produce an electro-optical device using a production process including a small number of simple steps.

More specifically, it is possible to produce a high performance TFT 30 having offset regions or LDD regions, or having both the offset regions and the LDD regions, together with a storage capacitor with a large capacitance added to the TFT 30 using the production process including a smaller number of steps associated with the photolithography process. It is also possible to suppress variations in characteristics caused by an alignment error of an exposure apparatus in the photolithography process, and thus, it is possible to form the TFT so as to have a shorter channel length which allows a reduction in the size of the electro-optical device.

As described above with reference to the production method of the semiconductor device, the steps following the step of forming the second insulating thin film 81 may be performed at temperatures equal to or lower than 400° C. In this case, materials having low heat resistance may be used to form conductive layers or insulating films in the steps after forming the second insulating thin film 81.

By further forming one or more conductive layers between the conductive layer 80a and the pixel electrode 9a via interlayer insulating films in a multilayer fashion, it is possible to further increase the storage capacitance by means of expansion in a vertical direction using a limited area on the TFT array substrate 10. The pixel switching TFT 30 of the present embodiment has offset regions or LDD regions, or both offset regions and LDD regions, formed in accordance with one of semiconductor device production methods disclosed above in the first to third embodiments, and thus the TFT 30 has an extremely low current in an off-state, which is very important in switching the pixel.

Although in the present embodiment, each pixel switching TFT 30 has a single-gate structure in which only a single gate electrode is formed of a part of a scanning line 3a between the high concentration source region 1d and the high concentration drain region 1e, two or more gate electrodes may be disposed between the source and drain regions. In this case, the same signal is applied to those two or more gate electrodes. In the case where the dual-gate structure or the triple-gate structure is employed, the resultant TFT has a less leakage current at junctions between the channel and the source and drain regions, and thus, the current in the off-state can be reduced. If at least one gate electrode of these is formed to have the LDD or offset structure, the current in the off-state is further reduced, and thus, it is possible to realize high-performance and high-reliability switching elements.

In the electro-optical device of the present embodiment, the data lines 6a and the scanning lines 3a are formed on the TFT array substrate 10 such that they cross each other at different levels via the first interlayer insulating film 4. The conductive layer 80a is disposed between the semiconductor layer 1a and the pixel electrode 9a, and the pixel electrode 9a is electrically connected to the high concentration drain region 1e via the contact holes 8a and 8b.

Compared with the case where the pixel electrode 9a is connected to the drain region via only single contact hole, the contact holes 8a and 8b are allowed to have a smaller diameter. In the case where only one contact hole is formed using an etching process with low selectivity, the etching accuracy becomes worse as the contact hole is etched to a greater depth, and thus, there is a possibility that etching occurs beyond the bottom of the insulating film and the thin semiconductor layer is etched across the entire thickness thereof, if the thickness of the semiconductor layer 1a is very small, such as 50 nm. To avoid the above problem, the dry etching process capable of forming the contact hole so as to have a small diameter has to be stopped before the etching reaches the semiconductor layer and the remaining part to the semiconductor layer has to be etched by means of wet etching. Otherwise, it is required to form a polysilicon film serving as an etching stopper.

In contrast, in the present embodiment, the pixel electrode 9a and the high concentration drain region 1e are connected to each other via two contact holes 8a and 8b, which can be easily formed by means of dry etching. Even when a mixture of wet and dry etching is employed, the distance of the contact holes etched by wet etching can be minimized. If it is desired to form the contact holes 8a and 8b so as to have a slightly tapered shape, wet etching may be performed intentionally for a short period of time after completion of dry etching.

As described above, the method of the present embodiment allows the contact holes 8a and 8b to be formed so as to have a smaller diameter, and a recess or a step formed on the surface of the conductive layer 80a at a location corresponding to the contact hole 8a is minimized, and thus, the pixel electrode 9a in the area above the contact hole 8a can be planarized in a better fashion. Similarly, a recess or a step formed on the surface of the pixel electrode 9a in an area at a location corresponding to the contact hole 8b is minimized, and thus, the pixel electrode 9a in this area can be planarized in a better fashion.

Furthermore, the conductive layer 80a is not damaged or melted during a heat treatment performed in a step after forming the conductive layer 80a. If the conductive layer 80a is formed of a refractive metal instead of Al, the resultant conductive layer 80a has high resistance to electric corrosion at a contact with the pixel electrode 9a formed of the ITO film, and thus, it is possible to achieve a good electrical connection between the conductive layer 80a and the pixel electrode 9a via the contact hole 8b. The conductive layer 80a is preferably formed so as to have a thickness in the range of, for example, 50 nm to 500 nm. If the thickness is greater than 50 nm, there is substantially no possibility that a contact hole will be etched further through the conductive layer during the process of forming the contact hole 8b. If the thickness is as large as about 500 nm, substantially no problems occur in terms of the recesses or steps on the surface of the pixel electrode 9a, or planarization can be accomplished rather easily.

The contact holes 8a, 8b, and 5 may have a circuit or rectangular shape or other polygonal shape in a horizontal cross section. However, it is desirable to form the contact holes into a circular shape because the circular shape prevents cracks from being produced in the interlayer insulating film or other films in the vicinity of the contact holes. It is also desirable to form the contact holes 8a, 8b, and 5 so as to have a slightly tapered shape by performing wet etching after completion of dry etching so that the tapered shape allows a better electric connection.

(General Construction of the Electro-optical Device)

Figure 9:
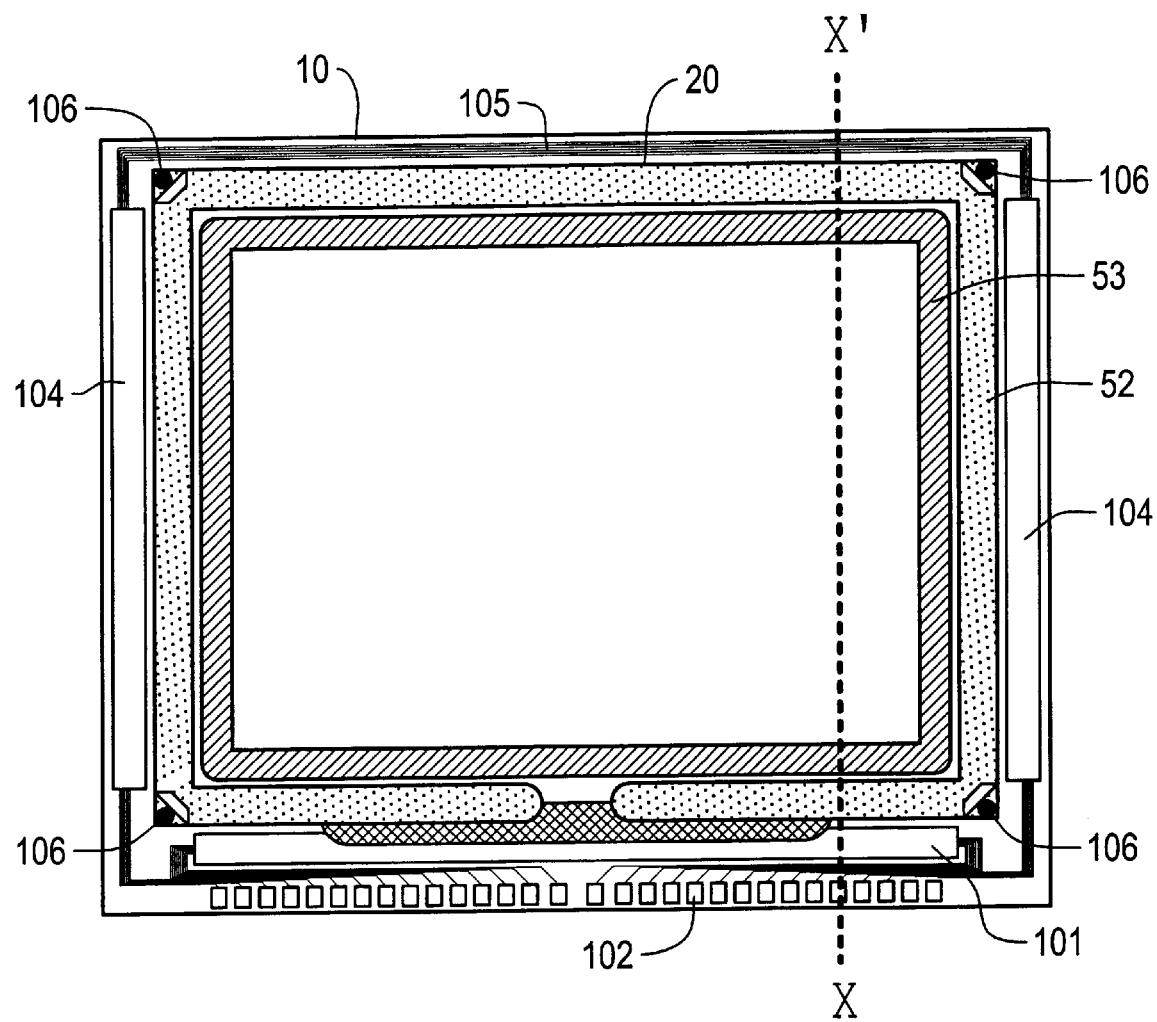
FIG. 9 is a plan view illustrating a TFT array substrate of a liquid crystal device which is an example of an electro-optical device according to one of the exemplary embodiments, wherein various elements formed on the TFT array substrate seen from an opposite substrate side are shown.
Figure 10:
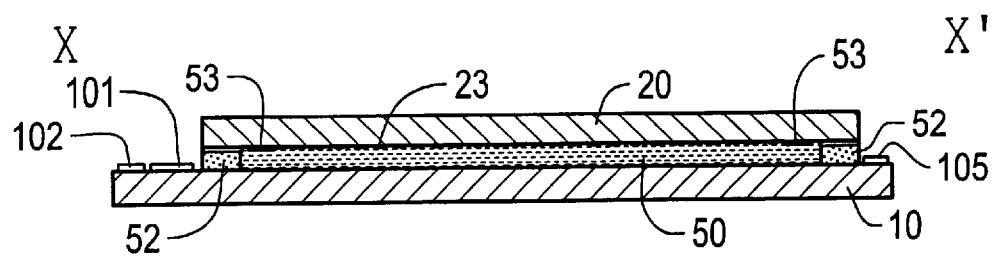
FIG. 10 is a cross-sectional view taken along line X–X' of FIG. 7.

The general construction of a liquid crystal device, which is an example of an electro-optical device realized according to one of the embodiments described above, is described below with reference to FIGS. 9 and 10. FIG. 9 is a plan view illustrating a TFT array substrate 10, wherein various elements formed on the TFT array substrate 10 seen from the side of an opposite substrate 20 are shown. FIG. 10 is a cross-sectional view taken along line X–X' of FIG. 9.

In FIG. 9, a sealing material 52 is disposed on the TFT array substrate 10 along its periphery. An opaque frame 53 formed of the same material as the light-shielding film 23, or a different material, is disposed inside the sealing material 52 so that the edges of the image displaying area are defined by the frame 53. In an area outside the sealing material 52, a data line driving circuit 101 for supplying an image signal over the data lines 6a for driving according to predetermined timing and external circuit connection terminals 102 are disposed along one side of the TFT array substrate 10. Along the two sides immediately adjacent to the above side, scanning line driving circuits 104 for supplying a scanning signal over the scanning lines 3a in accordance with predetermined timing are disposed. In the case where a delay in the propagation of the scanning signal supplied to the scanning lines 3a is allowed, the scanning line driving circuits 104 may be disposed only on one side.

The data line driving circuit 101 may be divided into two parts and they may be disposed at two sides of the image displaying area. For example, one data line driving circuit disposed along one side of the image display area may supply an image signal to odd-numbered data lines 6a, and the other data line driving circuit disposed along the opposite side of the image displaying area may supply an image signal to even-numbered data lines. When the data lines 6a are driven in the comb fashion as described above, the area where the data line driving circuit is formed may be expanded, and thus, it becomes possible to employ a complicated circuit.

A plurality of interconnections 105 extend along the remaining side on the TFT array substrate 10 so that the two scanning line driving circuits 104 disposed at the two sides of the image displaying area are connected to each other via the interconnections 105. A conducting element 106 is disposed on at least one corner of the opposite substrate 20 so that the TFT array substrate 10 and the opposite substrate 20 are electrically connected via the conducting element 106.

As shown in FIG. 10, the opposite substrate 20 having an outer shape and size similar to those of the sealing material 52 shown in FIG. 9 is bonded to the TFT array substrate 10 via the sealing material 52. In addition to the data line driving circuit 101 and the scanning line driving circuits 104, a sampling circuit for applying an image signal to a plurality of data lines 6a in accordance with predetermined timing, and a precharging circuit for supplying a precharging signal with a predetermined voltage level to the plurality of data lines 6a before supplying the image signal may also be disposed on the TFT array substrate 10. Furthermore, there may be provided a test circuit for testing the quality or detecting a defect in the liquid crystal device during the production process or before shipment. In the present embodiment, it is required that the light-shielding film 23 on the opposite substrate 20 be smaller in size than the light-shielding area of the TFT array substrate 10. Depending on the specific application of the liquid crystal device, the light-shielding film 23 may be removed.

In each embodiment described above with reference to FIGS. 1 to 10, a part of peripheral circuits such as a data line driving circuit 101 and scanning line driving circuits 104 may be formed in a driving LSI mounted on a TAB (tape automated bonding substrate) and electrically and mechanically connected to the TFT array substrate 10 via an anisotropic conducting film, instead of forming on the TFT array substrate 10. A polarizing film, a phase difference film, and/or a polarizer are properly disposed on the side of the opposite substrate 20 which is exposed to the projection light ray, and also on the side of the TFT array substrate 10 from which the projection light ray emerges, depending on the operation mode such as a TN (twisted nematic) mode, a VA (vertically aligned) mode, and a PDLC (polymer dispersed liquid crystal) mode, and depending on whether a normally white mode or a normally black mode is employed.

When the above-described liquid crystal device is used in a color liquid crystal projector, three similar liquid crystal devices are used as R (red), G (green), and B (blue) light valves, respectively, wherein light rays with different colors created by passing a light ray through RGB color separation dichroic mirrors pass through the respective liquid crystal devices. Therefore, in the embodiments of the invention, no color filter is disposed on the opposite substrate 20. However, an RGB color filter with a protective film may also be formed on the opposite substrate 20, in proper areas corresponding to the pixel electrodes 9a where the light-shielding film 23 is not formed. Alternatively, a color filter layer may be formed using a color resist or the like on the TFT array substrate 10 at a location below each pixel electrode 9a. This allows the liquid crystal device according to each embodiment to be employed in a color liquid crystal device of a type other than the liquid crystal projector, such as a direct-view-type or reflection-type color liquid crystal television set.

Furthermore, small lenses may be formed on the opposite substrate 20, at locations corresponding to the respective pixels so that the incident light is focused in a more efficient fashion, thereby achieving a brighter liquid crystal device. Still furthermore, an interference film consisting a large number of layers with different refractive index may be deposited on the opposite substrate 20, thereby forming a dichroic filter for producing an RGB color utilizing interference of light. By adding the dichroic filter to the opposite substrate, a still brighter color liquid crystal apparatus can be achieved.

Although in the above-described embodiments of liquid crystal devices, light is incident on the liquid crystal apparatus from the opposite substrate side as in the conventional liquid crystal devices, light may be incident on the device from the side of the TFT array substrate 10, and may emerge from the side of the opposite substrate 20, if a light-shielding film (not shown) is disposed between the TFT array substrate 10 and the underlying insulating film 12. That is, when the liquid crystal device is mounted on a liquid crystal projector, the channel region 1a' of the semiconductor layer 1a is protected from illumination of light, and thus, it is possible to display a high-quality image.

In the conventional techniques, to prevent light from being reflected at the back surface of the TFT array substrate 10, it is required to place an additional polarizer coated with an AR (anti-reflection) film at an outer location, or it is required to bond an AR film to the TFT array substrate 10. In contrast, in the embodiments of the present invention, if a light-shielding film is formed between the surface of the TFT array substrate 10 and the semiconductor layer 1a at least at locations corresponding to the channel region 1a', it becomes unnecessary to use an anti-reflection film or a polarizer with an anti-reflection film, or it becomes unnecessary to perform an anti-reflection process on the TFT array substrate 10 itself. Thus, according to the embodiments, it is possible to reduce the material cost.

Furthermore, because the polarizer is not required, no reduction in the production yield due to dust or defects occurs during the process of bonding a polarizer. Still furthermore, the excellent light-shielding property makes it possible to employ a bright light source or a polarizing beam splitter for achieving an improved light usage efficiency, without causing degradation in the image quality, such as light crosstalk.

As described above, because the TFT 30 of the present embodiment has offset regions or LDD regions, or both offset regions and LDD regions, formed in accordance with one of semiconductor device production methods disclosed above with reference to one of the first to third embodiments, the TFT 30 has an extremely low current in an off-state, which is very important in switching the pixel. The semiconductor device production method and the electro-optical device production method of the present invention are not limited to the details described in the respective embodiments, but various modifications and changes are possible without departing the scope and the spirit of the present invention as defined by the claims and as can be read through the specification. It should be understood that any semiconductor device and any electro-optical device including such a modification also fall within the scope of the present invention.

What is claimed is:

1. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode;

forming a conductive layer serving as a third capacitor electrode of said storage capacitor, said conductive layer being connected to said semiconductor layer and opposing said second capacitor electrode via said second insulating thin film;

forming a third insulating film on said conductive layer;

forming a data line over said third insulating film, said data line being overlapped with a channel region of said thin film transistor and electrically connected to said source region of said thin film transistor; and forming a pixel electrode over said data line.

2. The method of producing a semiconductor device, according to claim 1, said second insulating thin film being an oxide film formed by oxidizing the surface of said gate electrode and the surface of said second capacitor electrode.

3. The method of producing a semiconductor device, according to claim 2, said oxide film being a thermal oxide film formed by thermally oxidizing the surface of said gate electrode and the surface of said second capacitor electrode at a temperature in a range of 900° C. to 1200° C.

4. The method of producing a semiconductor device, according to claim 3, further comprising selectively doping an impurity into said semiconductor layer before of forming said thermal oxide film, said impurity doped in said semiconductor layer being activated when said thermal oxide film is formed in forming the thermal oxide film.

5. The method of producing a semiconductor device, according to claim 2, further comprising doping an impurity into said semiconductor layer using said gate electrode as a mask, before forming said second insulating thin film, and after doping an impurity into said semiconductor layer, said second insulating thin film being formed by oxidizing the surface of said gate electrode and the surface of said second capacitor electrode.

6. The method of producing a semiconductor device, according to claim 1, said gate electrode and said second capacitor electrode being formed of a silicon thin-film.

7. The method of producing a semiconductor device, according to claim 1, further comprising forming a third insulating thin film between said second insulating thin film and said conductive layer.

8. The method of producing a semiconductor device, according to claim 7, said third insulating thin film being formed of at least one of a silicon oxide film and a silicon nitride film.

9. A method of producing an electro-optical device comprising a data line and a pixel electrode both formed on a substrate of a semiconductor device produced according to the method of claim 1, said data line being connected to the source region of said thin film transistor, said pixel electrode being connected to the drain region of said thin film transistor, said method comprising:

forming a first interlayer insulating film on said semiconductor layer, said first insulating thin film, said gate electrode, said second insulating thin film, and said conductive layer;

forming said data line such that said data line is connected to said source region via a contact hole formed through said first interlayer insulating film, said first insulating thin film, and said second insulating thin film;

forming a second interlayer insulating film on said data line; and forming said pixel electrode such that said pixel electrode is connected to said conductive layer via a contact hole formed through said first interlayer insulating film and said second interlayer insulating film.

10. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode; and forming a conductive layer at temperatures equal to or lower than 400° C. after forming said second insulating thin film, said conductive layer serving as a third capacitor electrode of said storage capacitor, said conductive layer being connected to said semiconductor layer and opposing said second capacitor electrode via said second insulating thin film.

11. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode, said second insulating thin film being an anodic oxide film formed by anodizing the surface of said gate electrode and the surface of said second capacitor electrode; and forming a conductive layer serving as a third capacitor electrode of said storage capacitor, said conductive layer being connected to said semiconductor layer and opposing said second capacitor electrode via said second insulating thin film.

12. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode, said second insulating thin film being an anodic oxide film formed by anodizing the surface of said gate electrode and the surface of said second capacitor electrode, said gate electrode and said capacitor electrode being formed of tantalum or aluminum; and forming a conductive layer serving as a third capacitor electrode of said storage capacitor, said conductive layer being connected to said semiconductor layer and opposing said second capacitor electrode via said second insulating thin film.

13. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode, said second insulating thin film having a thickness in a range of 10 nm to 200 nm; and forming a conductive layer serving as a third capacitor electrode of said storage capacitor, said conductive layer being connected to said semiconductor layer and opposing said second capacitor electrode via said second insulating thin film.

14. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode;

forming a conductive layer serving as a third capacitor electrode of said storage capacitor, said conductive layer being connected to said semiconductor layer and opposing said second capacitor electrode via said second insulating thin film;

doping said semiconductor layer with a first concentration of impurity using said gate electrode as a mask, before forming said second insulating thin film; and doping said semiconductor layer with a second concentration of impurity via a mask which completely covers said gate electrode and which has a width greater than a width of said gate electrode.

15. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode;

forming a conductive layer serving as a third capacitor electrode of said storage capacitor, said conductive layer being connected to said semiconductor layer and opposing said second capacitor electrode via said second insulating thin film;

doping said semiconductor layer with a first concentration of impurity using said gate electrode as a mask, before forming said second insulating thin film; and selectively doping said semiconductor layer with a second concentration of impurity, after forming said second insulating thin film.

16. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode;

forming a conductive layer serving as a third capacitor electrode of said storage capacitor, said conductive layer being connected to said semiconductor layer and opposing said second capacitor electrode via said second insulating thin film; and selectively doping an impurity into said semiconductor layer after forming said second insulating thin film.

17. A method of producing a semiconductor device, comprising:

forming a semiconductor layer on a substrate, said semiconductor layer serving as a source region and a drain region of a thin film transistor and a first capacitor electrode of a storage capacitor;

forming a first insulating thin film on said semiconductor layer;

forming a gate electrode and a second capacitance electrode of said storage capacitor, on said first insulating thin film;

forming a second insulating thin film on a surface of said gate electrode and on a surface of said second capacitor electrode; and forming a conductive layer serving as a third capacitor electrode of said storage capacitor, said conductive layer being connected to said semiconductor layer and opposing said second capacitor electrode via said second insulating thin film, said third capacitor electrode being formed of a multilayer film including two or more layers of conductive polysilicon and refractory metal.

18. A semiconductor device comprising:

a semiconductor layer formed on a substrate so as to serve as a source region, a drain region, and a channel region of a thin film transistor and a first capacitor electrode of a storage capacitor;

a first insulating thin film formed on said semiconductor layer; a gate electrode and a second capacitor electrode of said storage capacitor both formed on said first insulating thin film;

a second insulating thin film formed on a surface of said gate electrode and on a surface of said second capacitor electrode;

a conductive layer serving as a third capacitor electrode of said storage capacitor, said conductive layer being connected to said semiconductor layer, said conductive layer opposing said second capacitor electrode via said second insulating thin film;

a third insulating film formed on said conductive layer;

a data line formed over said third insulating film, said data line being overlapped with a channel region of said thin film transistor and electrically connected to said source region of said thin film transistor; and a pixel electrode formed over said data line, at least one of the source region and the drain region of said thin film transistor including:
   a high-concentration impurity region;
   a low-concentration impurity region disposed between said high-concentration impurity region and said channel region; and
   an offset region disposed between said low-concentration impurity region and said channel region, said offset region being located directly adjacent to said channel region.

19. An electro-optical device comprising a data line and a pixel electrode both formed on a substrate of the semiconductor device according to claim 18, said data line being electrically connected to the source region of said thin film transistor, said pixel electrode being electrically connected to the drain region of said thin film transistor, said electro-optical device further comprising:

a first interlayer insulating film formed on said conductive layer; and a second interlayer insulating film formed on said first interlayer insulating film, said data line being electrically connected to said source region via a contact hole formed through said first interlayer insulating film, said first insulating thin film, and said second insulating thin film, said pixel electrode being electrically connected to said conductive layer via a contact hole formed through said first interlayer insulating film and said second interlayer insulating film.

* * * * *